United States Patent [19]

Dobbek et al.

[11] Patent Number: 5,937,435
[45] Date of Patent: Aug. 10, 1999

[54] SYSTEM AND METHOD FOR SKIP-SECTOR MAPPING IN A DATA RECORDING DISK DRIVE

[75] Inventors: Jeff J. Dobbek, San Jose; Steven Robert Hetzler, Sunnyvale, both of Calif.

[73] Assignee: International Business Machines Corporation, Armonk, N.Y.

[21] Appl. No.: 08/628,304

[22] Filed: Apr. 5, 1996

Related U.S. Application Data

[63] Continuation of application No. 08/173,588, Dec. 23, 1993, abandoned.

[51] Int. Cl.⁶ .................................................. G06F 12/10
[52] U.S. Cl. ........................ 711/202; 711/205; 711/206; 711/207; 711/220; 711/221
[58] Field of Search ............................ 395/404, 410, 395/412, 415, 416, 417, 421.1, 421.11; 711/4, 200, 202, 205, 206, 207, 220, 221

[56] References Cited

U.S. PATENT DOCUMENTS

| | | | |
|---|---|---|---|
| 4,513,392 | 4/1985 | Shenk | 364/900 |
| 4,527,273 | 7/1985 | Hibi et al. | 371/38 |
| 4,575,775 | 3/1986 | Albrecht | 360/77 |
| 4,631,723 | 12/1986 | Rathbun et al. | 371/10 |
| 4,656,532 | 4/1987 | Greenberg et al. | 360/48 |
| 4,677,606 | 6/1987 | Ogata et al. | 369/59 |
| 4,775,969 | 10/1988 | Osterlund | 369/53 |
| 4,792,936 | 12/1988 | Picard | 369/59 |
| 4,811,124 | 3/1989 | Dujari et al. | 396/59 |
| 4,827,462 | 5/1989 | Flannagan et al. | 369/32 |
| 4,839,878 | 6/1989 | Inoue | 369/54 |
| 4,862,295 | 8/1989 | Tanaka et al. | 360/48 |
| 4,894,734 | 1/1990 | Fischler et al. | 360/51 |
| 4,914,529 | 4/1990 | Bonke | 360/48 |
| 4,953,122 | 8/1990 | Williams | 364/900 |
| 4,972,316 | 11/1990 | Dixon et al. | 364/200 |

(List continued on next page.)

FOREIGN PATENT DOCUMENTS

| | | | |
|---|---|---|---|
| 0347032 | 4/1989 | European Pat. Off. | G06F 3/06 |
| 0420211 | 9/1990 | European Pat. Off. | G11B 20/18 |
| 0 522 750 A2 | 1/1993 | European Pat. Off. | G11B 10/12 |
| 63-70928 | 3/1988 | Japan | G11B 7/007 |
| 1-178172 | 7/1989 | Japan | G11B 7/007 |
| 3-16068 | 1/1991 | Japan | G11B 21/10 |
| 91/02354 | 2/1991 | WIPO | G11B 20/12 |
| 92/00589 | 1/1992 | WIPO | G11B 19/06 |

OTHER PUBLICATIONS

Low–Cost DASD 520–Byte To 512–Byte Format Conversion IBM TDB vol. 28 No. 7 Dec. 1985, pp.3001–3002 by R.A. Peterson et al.

Servo Channel/Multiprocessor Advance Data Sheet Jun. 1992, AT&T Microelectronics.

*Primary Examiner*—Eddie P. Chan
*Assistant Examiner*—Than V. Nguyen
*Attorney, Agent, or Firm*—Ingrid M. Foerster; Monica D. Lee

[57] ABSTRACT

A data recording disk drive includes a system and method for mapping around skip sectors, both bad sectors and spare sectors. A received logical block address is converted to a corresponding physical block address by mapping through a set of tables. A first table includes entries for virtual tracks which group together LBAs having shared high order bits. A second table contains entries for the skip sectors. The high order bits of a given LBA are used to select an entry in the first table, which entry is an index into the second table. Starting from the index point, the second table is searched, using the low order bits of the LBA, for a skip sector beyond the LBA value. Once the appropriate skip sector is found, the index of this skip sector within the second table is added to the LBA to compute the PBA. The PBA is then mapped to a zone, cylinder, head, sector location on the disk drive. The mapping system reduces the total storage required to convert LBAs to ZCHS values and improves the performance of the conversion process. Additional features include a third table for distinguishing bad sectors from spare sectors, schema for re-mapping spare sectors to substitute for data sectors which fail during use, and overlap between the LBA high order and low order bits to further improve performance.

7 Claims, 12 Drawing Sheets

U.S. PATENT DOCUMENTS

| | | | |
|---|---|---|---|
| 4,999,720 | 3/1991 | Wilson et al. | 360/48 |
| 5,034,914 | 7/1991 | Osterlund | 364/900 |
| 5,050,013 | 9/1991 | Holsinger | 360/72.1 |
| 5,070,421 | 12/1991 | Sumiya et al. | 360/77.07 |
| 5,073,834 | 12/1991 | Best et al. | 360/77.08 |
| 5,105,416 | 4/1992 | Segawa et al. | 369/116 |
| 5,121,280 | 6/1992 | King | 360/135 |
| 5,130,969 | 7/1992 | Sako | 369/58 |
| 5,146,571 | 9/1992 | Logan | 395/400 |
| 5,172,352 | 12/1992 | Kobayashi | 369/44.26 |
| 5,193,034 | 3/1993 | Tsuyoshi et al. | 360/51 |
| 5,196,970 | 3/1993 | Seko et al. | 360/77.03 |
| 5,210,660 | 5/1993 | Hetzler | 360/51 |
| 5,271,018 | 12/1993 | Chan | 371/10.2 |
| 5,276,868 | 1/1994 | Poole | 395/600 |
| 5,319,627 | 6/1994 | Shinno et al. | 369/54 |
| 5,329,629 | 7/1994 | Horst et al. | 711/5 |
| 5,367,652 | 11/1994 | Golden et al. | 711/4 |

Conversion with ID Fields

Conversion with Defect Map

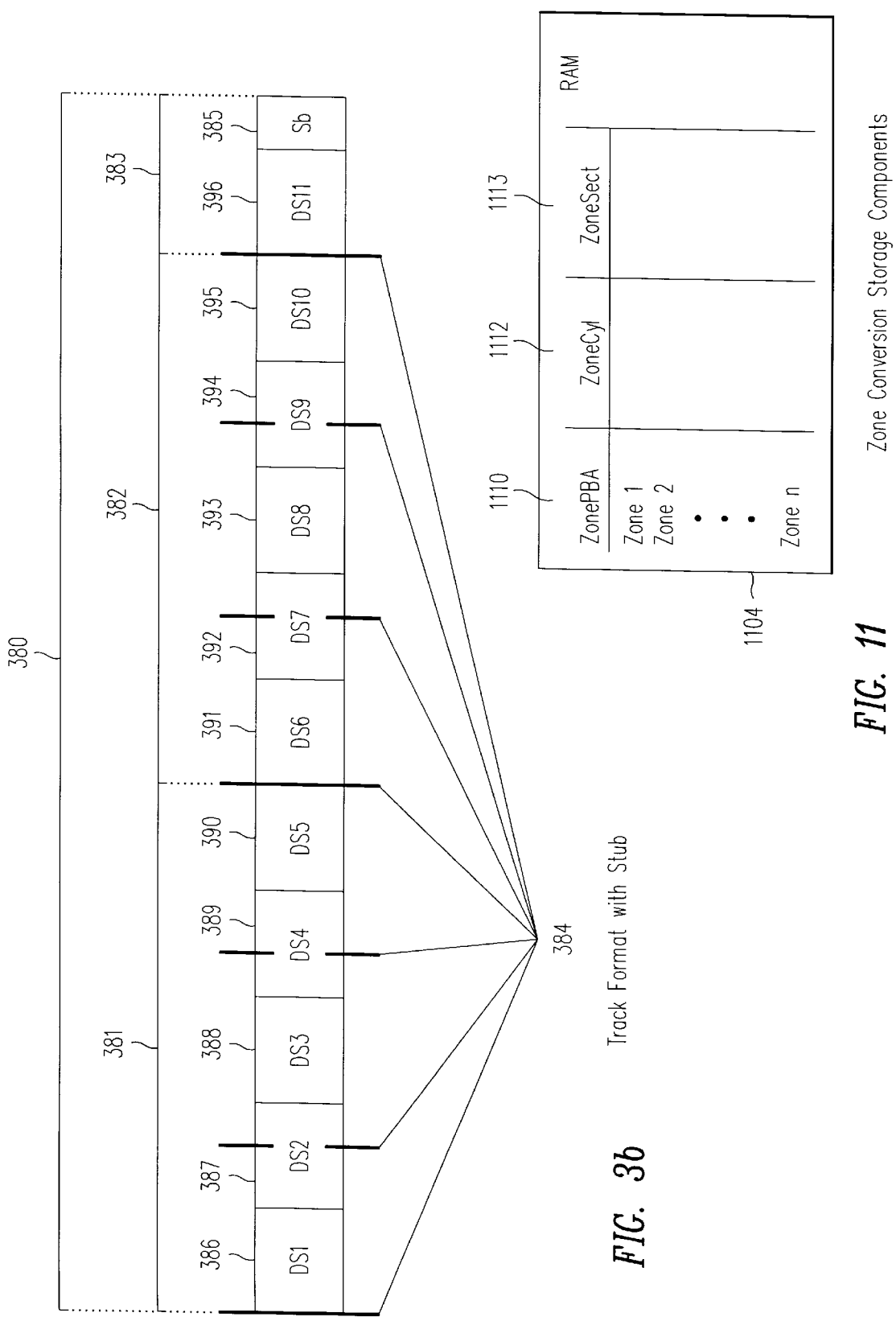

Disk Drive with Staggered Servo Write

LBA to PBA Mapping Architecture

LBA to PBA Conversion Computations

PBA to Zone, Cylinder, Head, Sector Computations

SYSTEM AND METHOD FOR SKIP-SECTOR MAPPING IN A DATA RECORDING DISK DRIVE

This is a continuation of application Ser. No. 08/173,588, filed Dec. 23, 1993, now abandoned.

FIELD OF THE INVENTION

This invention relates in general to data recording disk drives, and in particular to skip-sector mapping in such disk drives.

CROSS REFERENCE TO RELATED APPLICATION

This application is related to a co-pending patent application entitled "Sector Architecture for Fixed Block Disk Drive", filed Dec. 23, 1993, assigned to IBM.

BACKGROUND OF THE INVENTION

Central to the magnetic disk drive is the use of a data recording disk having a magnetizable layer on its surface. Digital data is recorded on the disk in the form of magnetic transitions spaced closely together. In modern disk drives in particular, recording densities both in terms of radial tracks per inch and linear density along a track have reached a level which creates extreme sensitivity to imperfections known as media defects in the magnetic recording layer which result in portions of the layer becoming unacceptable for use in recording the magnetic transitions. Media defects may be small, that is affecting only a small number of transitions on a small number of tracks, or large, affecting many transitions across multiple tracks. However, as recording densities increase even tiny media defects may impact many transitions across many tracks.

In the prior art, the classical method for dealing with media defects is called a format operation, in which surface analysis testing (SAT) data is used to effectively map defects found during SAT at the factory out of the disk drive. The format operation generally designates bad sectors and also designates some good sectors as spares so that they may later be used if additional good sectors become bad during operation of the disk drive. During the format operation an ID field is written onto the disk prior to each data sector. The ID field contains specific information concerning the data sector which follows it, including a logical block address (LBA) or a cylinder, head, sector (CHS) entry, either of which can be used during operation to unambiguously identify the succeeding data sector. Also included in the ID field are bit flags which indicate whether the data sector is a reserved (spare) sector or a bad data sector. At the end of the format operation, all information regarding good sectors, bad sectors, and spare sectors is known to the disk drive, and can be queried by scanning the entire set of sector IDs written on the disk.

In a typical prior art disk drive the translation from an LBA to a CHS is accomplished by direct mapping. Such a mapping is shown in prior art FIG. 1a, where LBA entries designated as 112 are mapped through LBA to CHS block 110 to produce CHS entries designated as 114. This mapping typically makes use of several assumptions: first, that the data sectors are grouped according to cylinders or tracks; second, that each group of data sectors contains a fixed number of good data sectors; and third, that the number of skip sectors (either defect or spare) in each group is fixed.

Many modern disk drives use a concept known as zone bit recording (ZBR) in which the disk surface is divided into radial zones and the data is recorded at a different data rate in each zone. This concept is well known in the art. The addition of zones requires expansion of the cylinder, head, sector identification scheme to a zone, cylinder, head, sector (ZCHS) scheme. Disk drives implementing zone bit recording typically use a table containing a set of zone entries, one for each zone, each entry containing the starting LBA for the zone represented by the entry, the number of good data sectors per group (where a group is some fixed unit such as a track or cylinder), the number of skip data sectors per group, the number of data sectors per track, and starting cylinder of the group. In such an implementation, a search for a given LBA simply requires locating the appropriate zone entry in the table. Thus, if the group is defined as a cylinder, the zone table can easily be used to determine an LBA offset, a cylinder offset, a track offset, a head, a sector, and a cylinder. Alternatively, if the group is defined as a track, the table can easily be used to determine an LBA offset, a track offset, a sector, a cylinder, and a head. Thus, regardless of the group definition, the LBA leads readily to a physical disk location. Once the disk drive completes the required seek operation to the cylinder and head identified, the drive formatter scans for either the desired LBA or the desired sector by examining the ID field of each data sector as it passes under the head. When the appropriate data sector is found, the data is transferred and the operation is complete.

As is apparent from the above description, the LBA to ZCHS mapping technique translates from an LBA to a first possible ZCHS. Scanning of IDs must thereafter be undertaken in order to locate the sought-after ZCHS or LBA. In fact, in some cases an extensive search may be required in order to locate the sought after sector starting from the location produced by the ZCHS mapping. At minimum, this search involves the reading of multiple ID fields, and in some cases may include reseeking to other heads or cylinders to find the required LBA. This may occur where a defect has caused an LBA to map to a ZCHS on a distant portion of the disk drive, or where a sought-after LBA maps to a ZCHS which would be near the end of a track but for a single defect or relatively small number of defects which causes it to map to a ZCHS on the next or another nearby track which nonetheless requires a head switch or a cylinder seek. The result of the added seek, is a performance penalty coupled with a power consumption penalty due to the added time spent seeking and reading ID fields. This penalty, coupled with the large number of sectors which may be affected by a defect in highly dense modern drives, can make skip sector handling a significant issue in overall drive performance.

Another strategy which has been used in recent years to increase the capacity of disk drives is known as the no-ID format. This format is taught by Hetzler in co-pending U.S. patent application Ser. No. 07/727,680, filed Jul. 10, 1991. No-ID disk drives use servo sectors in combination with a defect map to identify data sectors and thereby completely eliminate the use of ID regions. The no-ID skip-sector mapping concept is illustrated in prior art FIG. 1b in which an LBA input at 126 enters LBA to PBA conversion block 120. LBA to PBA conversion block 120 refers to a defect map table designated as 124 via interface 130. For performance reasons defect map table 124 is typically held in RAM storage. As disclosed in the aforementioned Hetzler application, the defect map table is comprised of a series of five byte entries which represent the defect information. Completing prior art FIG. 1b, the output PBA is communicated via interface 128 to PBA-to-cylinder, head, sector (CHS) conversion block 122, where additional function produces a physical CHS value which is further transmitted via interface 132 to electronics (not shown) which proceed to position the recording head.

While the aforementioned Hetzler approach solves the problem of locating defect information in the absence of data ID fields, it incurs two drawbacks. First, in requiring at least five bytes per entry to store the defect information, the approach is RAM intensive. Second, its performance is based on a binary search of three or four byte entries—a very slow process when implemented on an eight or sixteen bit microprocessor.

One way to improve upon the above approach is to use a table which contains only a three or four byte entry for each skip sector. This may be accomplished by listing the skip PBAs sequentially rather than listing skip LBAs and offsets; thereby a savings of two bytes per entry is realized. However, this approach occurs an added drawback of its own—while it requires only three to four bytes of RAM per skip sector, it also requires an iterative search algorithm whose performance is unacceptable in modern disk drives.

An additional problem that arises in high capacity disk drives involves the second category of skip sectors described above—spares. In general, in the prior art it is assumed that there is a fixed number of good sectors per group across each disk of a disk drive. However, for disks which outperform the assumed number of bad sectors, significant waste of storage space may occur due to this over sparing.

A closer examination of the oversparing problem reveals that it results from two statistical assumptions. First, in many disk drive designs it is assumed that the probability of a "grown" defect—that is, a defect not found during surface analysis testing (SAT) but which is revealed during drive use—is the same as the probability of a defect during SAT. In fact, however, grown defects are much less likely to occur after SAT is completed. Second, it is typically assumed that there is a fixed number of skip sectors per group. As a result of this assumption, when yield decreases spare allotment must be increased. This effect is multiplied by the number of groups, causing what is in effect a worse case assumption to be propagated over scores of good groups. In a typical modern disk drive this may involve a multiplication factor of over 3,000, a number which will continue to grow as track pitch continues to increase.

A further drawback associated with sparing as typically used in the prior art arises when spares are actually brought into service. The usual approach is to have a pool of spares gathered together in certain tracks and available for use across the disk drive. However, if one of these spares must be brought into service due to a grown defect, a significant performance penalty may result each time the spare sector is referred to in operation. The performance penalty results when the system, which is otherwise reading along sequential sectors on a track, is required to perform a seek operation to a different cylinder or a different head in order to access the data on the spared-in sector. This operation can in fact require many multiples of the amount of time required to perform an access operation on a sequentially available data sector.

Accordingly there has heretofore existed an unmet need in the art for a skip sector mapping technique which achieves satisfactory performance and requires minimal storage. There has further existed such an unmet need for a technique which can effectively provide sparing without wasting disk space and without incurring a significant performance penalty upon activation of a spare.

SUMMARY OF THE INVENTION

In accordance with the invention, a data recording disk drive is provided with a system and method for mapping logical block addresses into disk drive physical block addresses, for further mapping into zone, cylinder, head, and sector locations. A logical block address (LBA) is numbered from zero to N where N is the total number of blocks (sectors) available for customer and/or system use. A physical block address (PBA) is defined to include all sectors numbered from zero to M where M is greater than N and where M represents the total number of sectors available on the disk drive. The physical storage space represented by the total number of M PBAs in the disk drive identifies all LBAs as well as all skip sectors.

Two mapping tables are provided for use in translating LBAs to PBAs. The first mapping table contains entries for virtual tracks defined to group together LBAs having shared high order bits. The entries themselves are pointers to index locations in the second mapping table; each index location identifies a group of sectors located on the track corresponding to the index location. The second mapping table contains entries for skip sectors (both defective and spare). The entries are arranged in numerical order, and contain only the low order LBA bits corresponding to the skip sectors. To map a given LBA, a mask is used to select the high order bits which make up the virtual track number. The virtual track number of the LBA is used to select an entry in the first table, which in turn provides an index to a search start point in the second table. Commencing with the search start point, the second table is searched in increasing numerical order using the low order bits of the LBA until a larger entry is found (corresponding to a sector beyond the LBA). An index point up to (but not including) the final searched entry is then added to the LBA to provide the PBA. By removing the shared high order bits from the second (skip sector) table, its storage requirement is significantly reduced; since the search involves smaller entries, its execution speed is significantly increased.

An additional feature of the invention is a third table which includes an entry corresponding to each entry in the skip sector table. Each entry indicates whether the corresponding skip sector is a defective sector or a spare sector. This information is used by a further feature of the invention to remove data sectors from service when they become defective during operation of the disk drive. Using the third table, the closest spare sector to the failed sector is located. This spare may then be removed from the skip sector table and an entry added to the skip sector table for the failed sector. A still further feature of the invention is the use of overlap between the LBA bits used to identify the virtual tracks and those used in the skip sector table. The overlapping bits allow the skip sector table to differentiate neighboring tracks from one another, thus reducing and in some cases eliminating the need to refer to the first mapping table. This in turn further improves the performance of the disk drive.

BRIEF DESCRIPTION OF THE DRAWINGS

FIG. 3b is a schematic diagram illustrating a track format with a stub in accordance with the present invention.

FIG. 11 is a memory map table illustrating zone conversion storage components in accordance with the present invention.

I. Sector Architecture

Figure 1A:
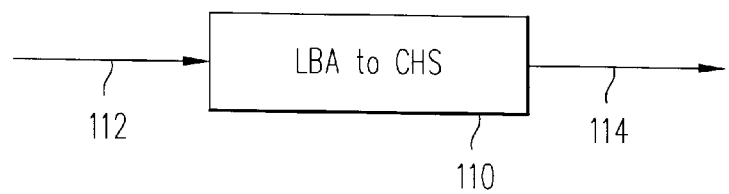
FIG. 1a is a block diagram illustrating a sector conversion process in accordance with the prior art.
Figure 1B:
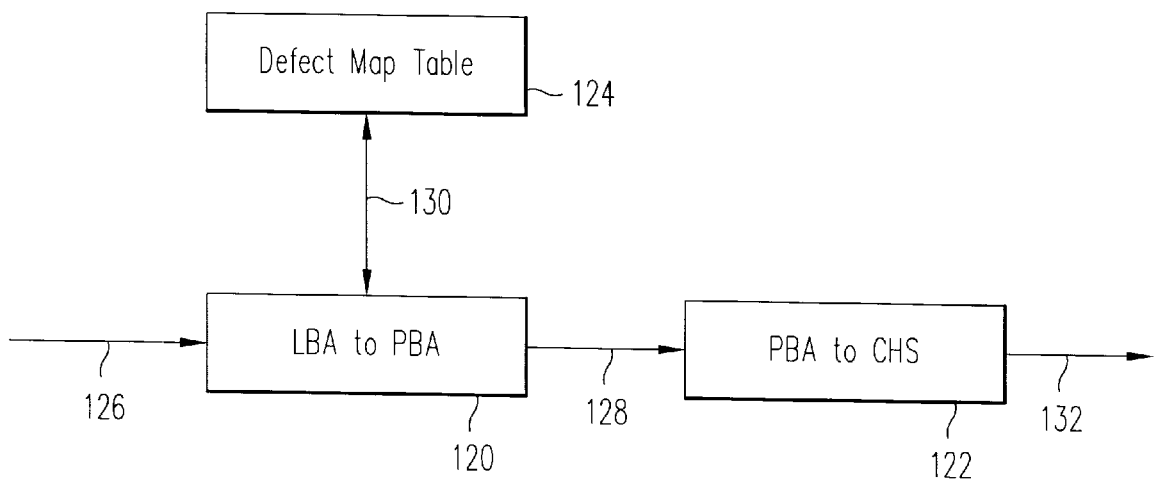
FIG. 1b is a block diagram illustrating a sector conversion process using a defect map in accordance with the prior art.
Figure 2:
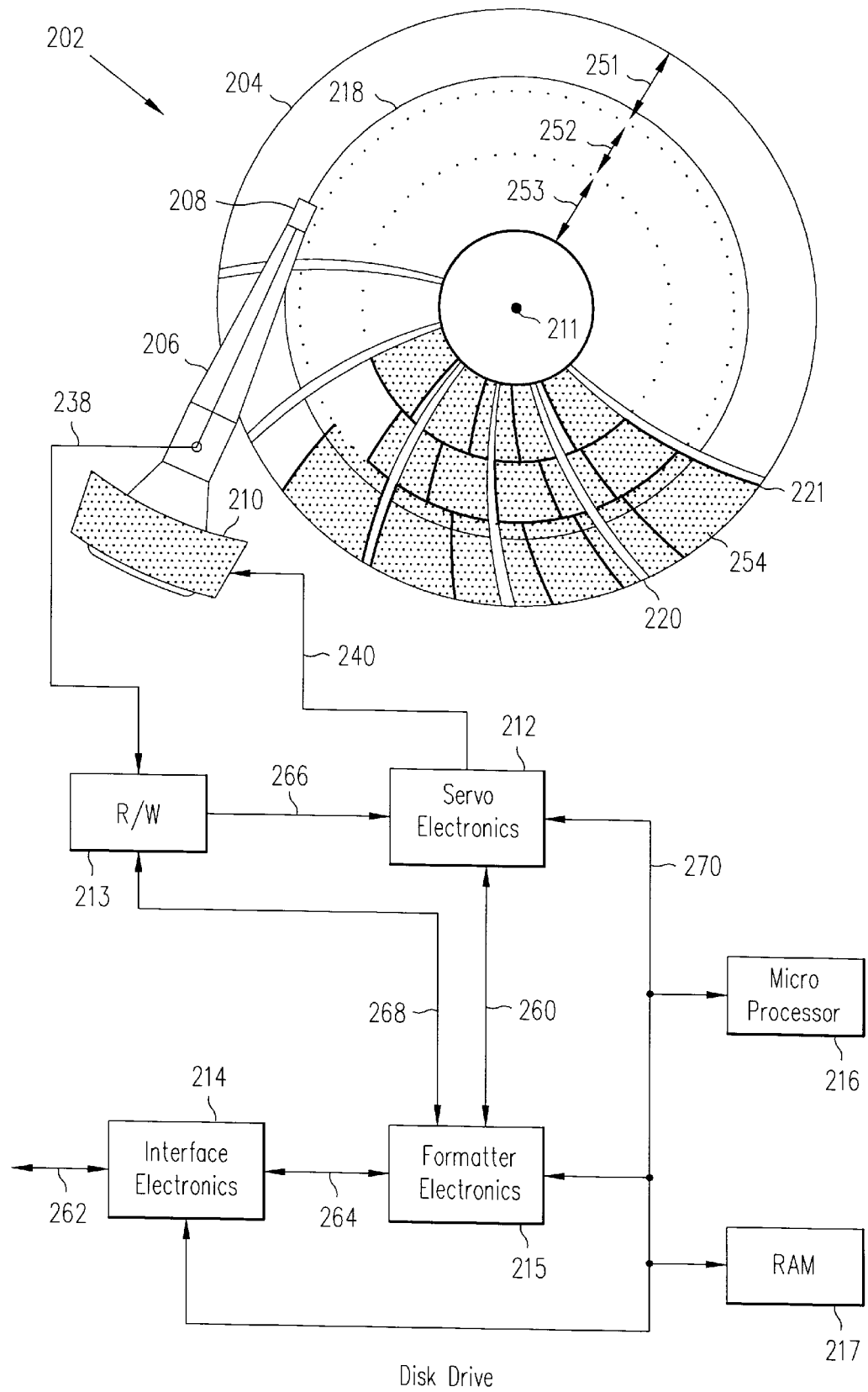
FIG. 2 is a schematic diagram illustrating a fixed block architecture disk drive in accordance with the present invention.

Shown in FIG. 2 is a disk drive configured in accordance with the present invention. The disk drive is formatted using a fixed block architecture with sector servo and zone-bit recording. The disk drive, designated generally as 202, includes data recording disk 204, actuator arm 206, data recording transducer 208 (also called a recording head), voice coil motor 210, servo electronics 212, read/write electronics 213, interface electronics 214, formatter electronics 215, microprocessor 216 and RAM 217. Data recording disk 204 includes center of rotation 211, and is divided for head positioning purposes into a set of radially spaced tracks, one of which is shown at 218. The tracks are grouped radially into a number of zones, three of which are shown as 251, 252 and 253. The disk contains a plurality of servo sectors 220, which extend across the tracks in a generally radial direction. Each track has a reference index 221. Within each zone, the tracks are also circumferentially divided into a number of data sectors 254. As will be discussed hereafter, the data sectors contain no sector ID fields. In accordance with the normal meaning of "fixed block architecture", all data sectors are substantially the same size, expressed in bytes of data. However, it should be noted that the present invention may easily be adapted to tolerate some variation in data sector size, such as from 512 bytes per sector to 520 bytes per sector, in the event such a configuration was desirable for a particular implementation. The number of data sectors per track varies from zone to zone, and some of the data sectors do not begin immediately following a servo sector. Further, some of the data sectors are split by servo sectors. If the disk drive has multiple heads, then the set of tracks which are at the same radius on all surfaces is referred to as a "cylinder".

Read/write electronics 213 receives signals from transducer 208, passes servo information to servo electronics 212, and passes data signals to formatter 215. Servo electronics 212 uses the servo information to produce a current at 240 which drives voice coil motor 210 to position recording transducer 208. Interface electronics 214 communicates with a host system (not shown) over interface 262, passing data and command information. Interface electronics 214 also communicates with formatter 215 over interface 264. Microprocessor 216 communicates with the various other electronics over interface 270.

In the operation of disk drive 202, interface electronics 214 receives a request for reading or writing data sectors over interface 262. Formatter electronics 215 receives a list of requested data sectors from interface electronics 214 and converts them into zone, cylinder, head and data sector numbers which uniquely identify the location of the desired data sectors. The head and cylinder information are passed to servo electronics 212, which is responsible for positioning recording head 208 over the appropriate data sector on the appropriate cylinder. If the cylinder number provided to servo electronics 212 is not the same as the track number over which recording head 208 is presently positioned, servo electronics 212 first executes a seek operation in order to reposition recording head 208 over the appropriate cylinder.

Once servo electronics 212 has positioned recording head 208 over the appropriate cylinder, servo electronics 212 begins executing sector computations in order to locate and identify the desired data sector. As servo sectors 220 pass under recording head 208, the no-ID approach described in aforementioned U.S. patent application Ser. No. 07/727,680 is used to identify each servo sector. In brief, an index mark identifies the first servo sector, an address mark locates subsequent servo sectors, and a count of address marks uniquely identifies each servo sector. Additional information, which is described in greater detail below, is maintained in association with servo electronics 212 and formatter electronics 215 and is used to determine whether the present servo sector splits a data sector or whether a new data sector starts immediately following the present servo sector. Further information is maintained in servo electronics 212 and formatter electronics 215 which identifies the location of (or the distance to) the start of the next data sector from the present servo sector. Still further information is maintained which identifies the location of (or the distance to) any additional data sectors which begin before the next subsequent servo sector. Still further information identifies the number of the data sector from the index mark. This information is used to allow formatter electronics 215 to compare the data sector number passing under the recording head with the list of sectors received from interface electronics 214.

Figure 3A:
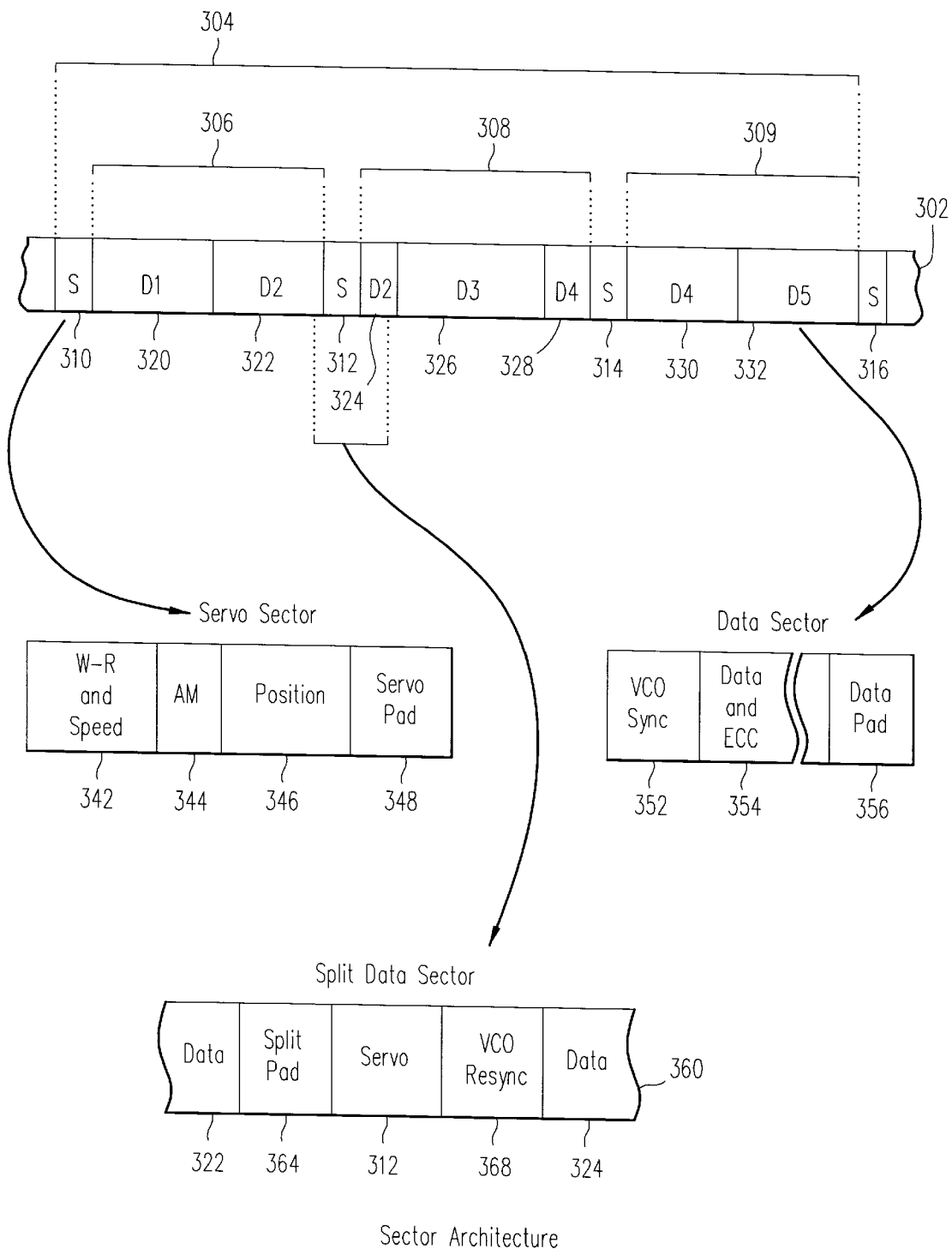
FIG. 3a is a schematic diagram illustrating a segment subdivision of a data recording track in accordance with the present invention.

Shown in FIG. 3a is a detailed schematic diagram of the sector architecture for an exemplary track from a data recording disk in accordance with the present invention. A portion of a track is shown as 302, containing segment 304. Segment 304 is subdivided into a plurality of data regions, 306, 308 and 309. The data regions are separated from one another by servo sectors 310, 312, and 314. Segment 304 also includes a plurality of data sectors labeled D1 through D5. Finally, each data sector is made up of one or more data sections, labeled 320, 322, 324, 326, 328, 330 and 332. Logically, a segment is the set of servo sectors and data sectors having a unique spatial relationship between the sectors. The format for a track may then be produced by repeating the segment. A data region is the space between adjacent servo sectors. A data sector is the smallest individually addressable unit of user data, independently readable and writable. Finally, a data section is a contiguous portion of a data sector, not interrupted by a servo sector.

The exemplary track of FIG. 3a contains a number of data sectors and a number of servo sectors, not necessarily equal. Note that servo sector 316 is not part of the segment since data sector D5 ends just prior to servo sector 316. Each data region contains a number of data sectors, some of which may be split by servo sectors. For example, region 306 contains the entire data sector D1 (section 320), and only a portion of data sector D2 (section 322). Likewise, data sector D2 is split by servo sector 312 into sections 322 and 324.

Also shown in FIG. 3a are details of the contents of servo sector 310. Write-to-read recovery and speed compensation field 342 is used to allow the read/write electronics to switch from a data writing operation to a servo reading operation, and to allow for fluctuations in the disk rotational speed. Address mark field 344 precisely identifies a specific position within the servo sector which is used as a timing reference. Position field 346 contains the actual servo information used to position the head, typically including a position error signal and other information such as a track number (track ID or TID), index value, servo sector number (or any portion thereof) and head number (or any portion thereof). Servo pad field 348 allows for the electronics to switch from reading servo to writing or reading data, as well as for disk rotational speed variations.

Also shown in FIG. 3a are details of the contents of data section 332, which contains a full data sector D5. VCO sync field 352 permits the read/write electronics to enable the voltage controlled oscillator (also known as a phase locked loop) to obtain proper phase lock for reading the data. Data and ECC field 354 contains the user data and error correction information. Data pad field 356 allows for differences in processing time for reading and writing data, as well as for flushing any encoder/decoder, and for disk rotational speed variations. It also provides sufficient time for the electronics to prepare for operating on the following servo or data sector.

Also shown in FIG. 3a is a detailed view of split data sector D2, labeled 360. Two additional fields are typically required when a data sector is split by a servo sector: split pad 364 and a VCO resync 368. Field 322 shows a portion of data sector D2 prior to servo sector 312. Split pad field 364 allows for the electronics to interrupt the reading or writing of data in a manner well known in the art. Servo sector 312 is followed by VCO resync field 368, which is used to restore the system to allow for continuation of the read or write operation. Finally, a portion of data section D2 following servo sector 312 is shown at 324. Note that split pad field 364 may be the same number of bytes in length as data pad field 356, or it may be different. Also, VCO resync field 368 may be identical in content to VCO sync field 352, but this is not required. More capacity may be achieved by making fields 364 and 368 shorter than their counterparts 352 and 356; methods for achieving this benefit are discussed in the prior art.

For any given data recording disk drive, there is a fixed number of servo sectors per track (hereinafter designated as N) throughout the disk. Also, for each zone there is a fixed number of data sectors on each track (hereinafter designated as M). If M is not a multiple of N, then some of the data sectors will be split by servo sectors. The split portions of each data sector are denoted as sections. Further, the first section belonging to a data sector is called the primary section and any remaining sections are called secondary sections. Since all data sectors on a track have the same number of bytes, and since the servo sectors are equally spaced, there will be a limited number of unique data sections on the disk drive. The set of data sectors and servo sectors which defines one period of the unique pattern of data sections is called a segment. The number of data sections in a segment (hereinafter designated as nss) is given by:

$$nss = m + n - 1 \tag{1}$$

where $$\frac{m}{n}$$

represents the reduced fraction of $$\frac{M}{N}.$$

Since m and n represent the numerator and denominator of the reduced fraction of the ratio of the number of data sectors per track to the number of servo sectors per track, it is apparent that there are n servo sectors and m data sectors in a segment. For exemplary segment 304 shown in FIG. 3a, n=3, m=5, nss=7, N=84, M=140, and nst (the number of segments per track)=28. It is to be noted that in accordance with the no-ID sector architecture, neither the servo sectors nor the data sectors include data ID fields. Instead, the information necessary to identify data sector numbers and data sector locations is provided in servo sectors 310, 312, 314, etc. and in electronic storage accessible to the servo electronics, as will be described in greater detail below.

It should be noted that the choice of the segment configuration is flexible. For example, the entire track could be defined as a segment. In some circumstances, this may be the natural choice, such as when M and N are relatively prime, resulting in m=M and n=N. However, nothing precludes choosing $$\frac{m}{n}$$

to be an integer multiple of the reduced fraction. Moreover, there are cases where the above analysis on the ratio of the number of servo sectors to the number of data sectors is not the preferred choice for defining a segment. This can occur when a space is left at the end of a track, where the last data sector on the track ends substantially prior to the end of the track. Such a case is illustrated in FIG. 3b. The track is designated 380, and contains 7 servo sectors 384. There are 11 data sectors, DS1 through DS11. Note that data sector DS11 ends prior to the end of track 380. The remaining space is stub 385, which contains no user data since it is shorter than a data sector. In this example, N=7 and M=11, which from the above analysis would lead to a segment size of n=7 and m=11. However, FIG. 3b illustrates a second possibility. The unique spatial relationship between the servo sectors and data sectors is achieved with n=3 and m=5. This choice results in two full segments, 381 and 382, and one partial segment 383. The disk drive need only know the total number of data sectors on the track to handle the partial segment. Once the data sector number has reached the maximum value, the drive will wait until the next servo sector, which resets the data sector counter to the first data sector number. It is to be noted that a track format having multiple stubs may be selected, including stubs located within tracks as well as at their ends. In any event, an advantage may in some cases be achieved in the presence of stubs by redefining the region using a smaller segment size since this in turn decreases the amount of memory required to store the format information.

II. Formatter and Servo Electronics

Figure 4:
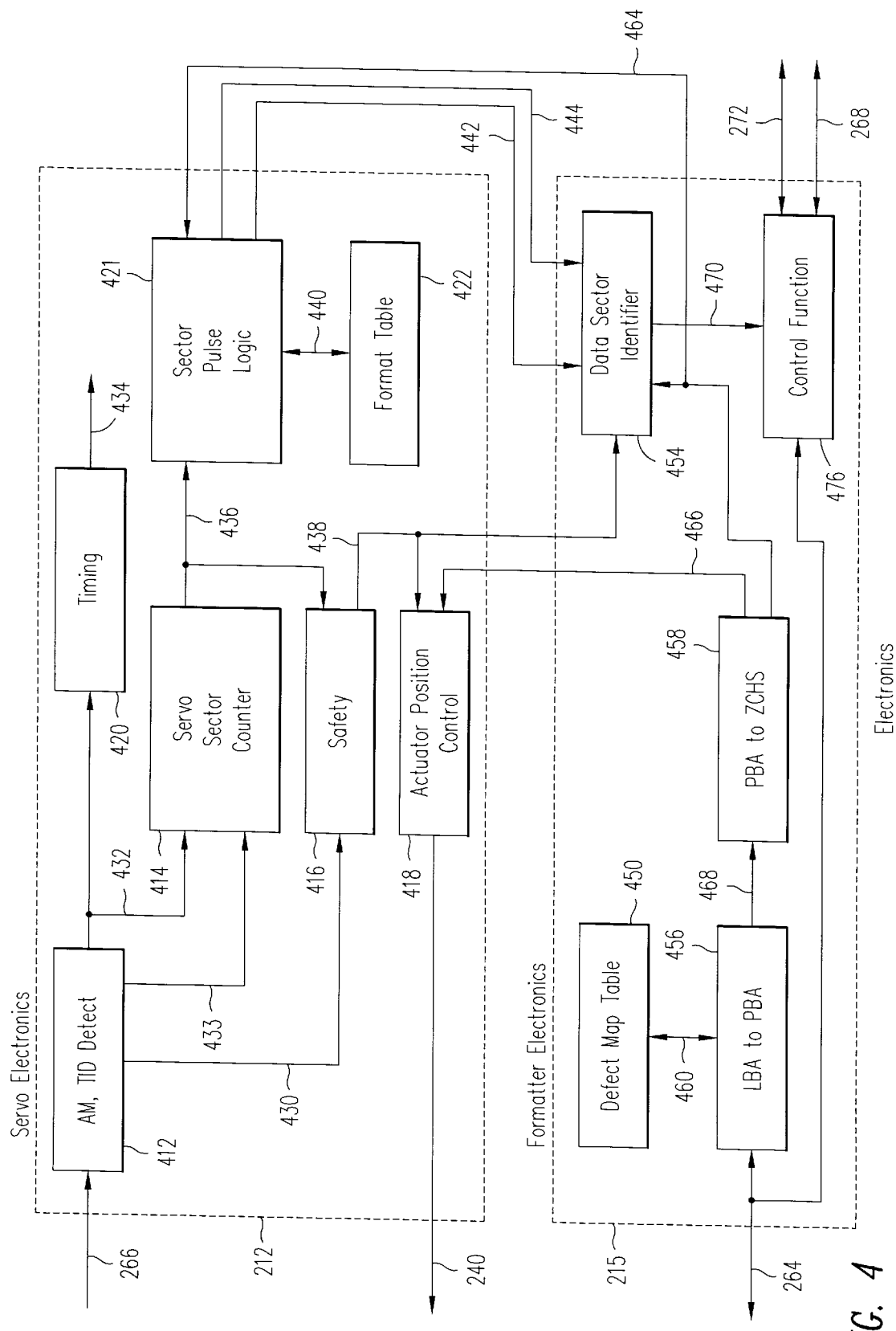
FIG. 4 is a block diagram illustrating a hardware embodiment of the servo functions of the present invention.

FIG. 4. is a schematic diagram of the preferred embodiment of the servo and formatter electronics used to locate and identify data sectors according to the present invention. Servo electronics 212 includes address mark (AM) detector and track number (TID) decoder 412, servo sector counter 414, safety logic 416, actuator position control logic 418, timing generation logic 420, sector pulse generation logic 421 and format table 422. Formatter electronics 215 includes defect map table 450, data sector identifier 454, logical block address (LBA) to physical block address (PBA) converter 456, PBA to zone, cylinder, head and data sector (ZCHS) converter 458 and control function 476.

In operation, formatter 212 receives a request for a read or write operation on a list of data sectors 264. The sectors are identified by their LBAs. The LBA list is converted to a PBA list by converter 456 using defect information 460. The PBA list 468 is converted to a list of physical ZCHS. Both of these conversions processed are discussed fully in section VI below. The cylinder and head values 466 (C and H) are passed to actuator position control logic 418 to affect a seek. Actuator position control logic 418 functions in a manner known in the art. Zone and sector values 464 (Z and S) are passed to data sector identifier 454 and to servo electronics 212. Additionally, servo electronics 212 receives servo information 266 from the read/write electronics. AM detector 412 detects the servo address mark, and signals address mark found (AMF) at 432. This signal is passed to timing logic 420, which generates the timing signals necessary for operation of servo electronics 212. AMF 432 is also passed to servo sector counter 414. In addition, AM detector 412 decodes the TID information, including cylinder (track) number, servo index, servo sector number and head number. Index signal 433 is used to reset servo sector counter 414, and the counter is incremented by AMF signal 432 at each subsequent servo. In this manner, the servo sector counter will always output the current servo sector number at 436. Safety logic 416 receives decoded TID information 430, and servo sector number 436. This logic performs various safety tests to ensure the proper operation of the servo electronics. Its functions include comparing the generated servo sector number 436 with any servo sector number information in the TID (including index) and processing any error handling information in the TID. Error information, along with the cylinder and head number, are output at 438. Actuator position control 418 compares the cylinder and head values 438 with the target values 466, and acts upon any errors. Sector pulse logic 421 uses servo sector number 436 to generate the address for format table 422, retrieving segment information 440 for the zone (described in detail below). Sector pulse logic 421 also contains three counters: a sync counter, a data counter, and a pad counter. Each of these counters is used to count byte clocks during the various fields in the format, whereby the data sectors are located and identified. Sector pulse logic 421 is thereby able to identify both the starting location and the data sector number of the data sector about to pass under recording head 208. The current data sector number 442 is sent to formatter electronics 215, and a start of data sector pulse 444 is sent when the start of a data sector is under the head, enabling the formatter to perform functions with zero latency. Upon receipt of sector pulse 444, data sector identifier 454 compares the current data sector number 442 to the list of ZCHS values 464. If a match is found, this information is passed via 470 to control function logic 476, at which point the data sector is further processed in accordance with methods known in the prior art.

With reference to the fields described above, it is to be noted that many alternative configurations exist which would accomplish the same purpose. For instance, the LBA may be replaced with any logical identifier, while the ZCHS may be replaced with any value or combination of values identifying a unique sector number. The combination of the above electronics and microcode in microprocessor 216 is able to detect and act on any errors discovered between the target ZCHS values and the detected values. This provides the disk drive with a high degree of reliability, even in the absence of data ID fields. For example, if a detected track number does not match the target value, a seek error will be posted, and this error may be handled as is known in the art. Other errors, such as a mismatch between the servo sector counter and the TID information (index and possible servo sector number bits) will be detected by safety logic 416, for action by other parts of the drive. Such errors may be handled as data ID mis-compares, and recovered by forcing the servo sector counter to align with the index mark and repeating the operation. Finally, as will be described in greater detail below, an important input required for sector pulse logic 421 to continuously compute data sector locations is a servo-modulo count. The servo-modulo count allows for a reduction in the total memory required for the format information by taking advantage of repetitive patterns in the format.

III. Locating and Identifying Data Sectors

Figure 5:
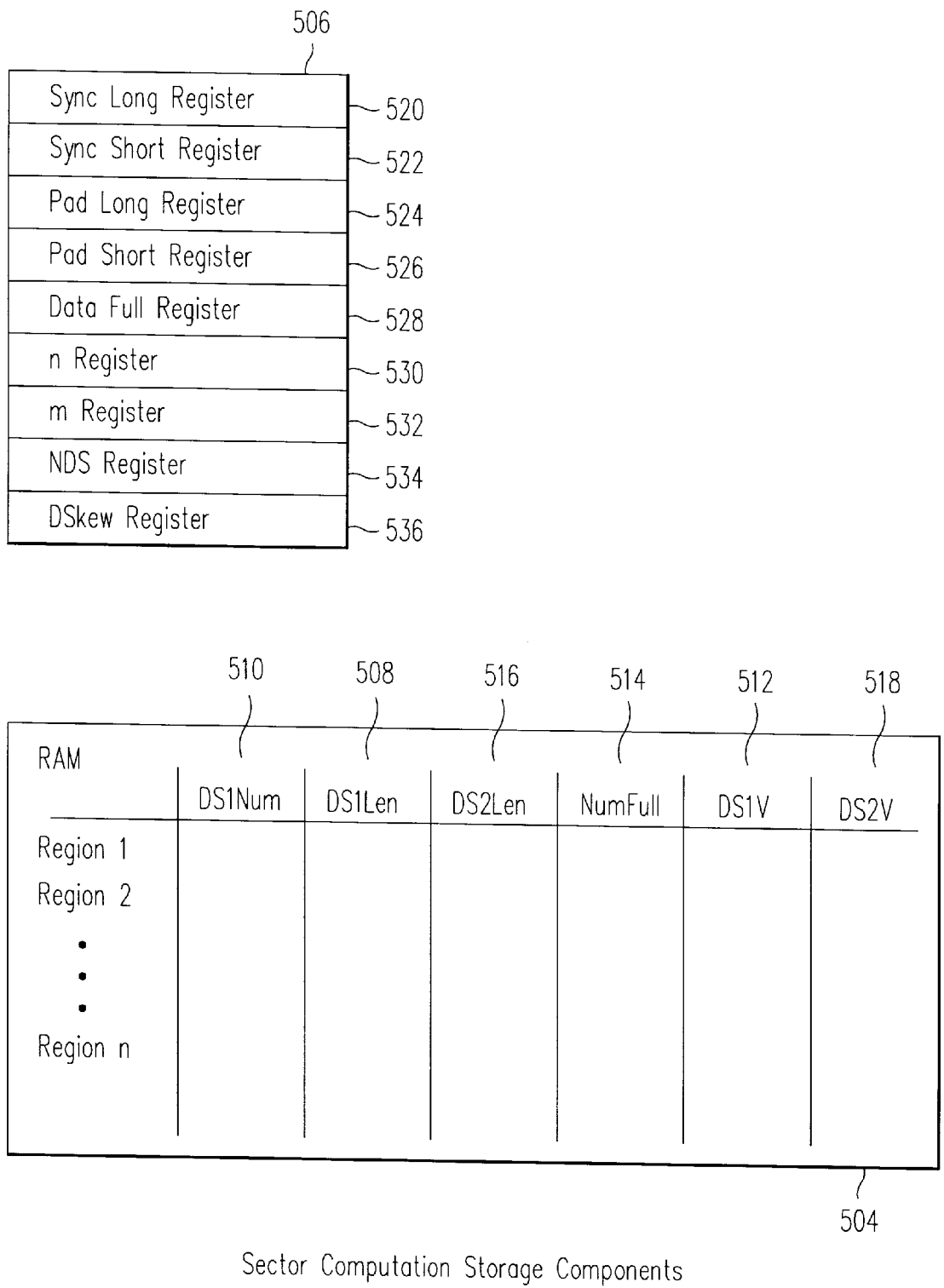
FIG. 5 is a block diagram illustrating the storage components used to compute data sector locations in accordance with the present invention.

Shown in FIG. 5 are the components required for sector computation in accordance with the present invention. In general, there is provided a random access memory 504 and a set of registers designated as 506, connected to an address and data bus (not shown). These may reside within servo electronics 212, in format table 422. Microprocessor 216 (or other electronics) stores information in the random access memory and in the registers, and then accesses this information in order to perform sector identification and location computations.

In particular, RAM 504 stores the information required to identify the data in each region in a given unique segment. For convenience of description the information fields are shown organized into a table format, although any appropriate data structure may be substituted. RAM 504 is addressed by the region within the segment (equivalent to the servo sector number within the segment). The fields required for each region include DS1Len 508, DS1Num 510, DS1V 512, NumFull 514, DS2Len 516, and DS2V 518. DS1Num is the number, from the start of the segment, of the first data sector following the servo. In the preferred embodiment, this field contains a 7 bit value. DS1Len is the length in bytes of the first data section in the region. In the preferred embodiment, this field contains a 10 bit value. DS2Len is the length in bytes of the last data section in the region. In the preferred embodiment, this field contains a 10 bit value. NumFull is the number of full (not split) data sectors in the region. In the preferred embodiment, this field contains a 3 bit value. DS1V is a flag, which if set, indicates that the first data sector is split, and therefore that the value DS1Len is valid. In the preferred embodiment, this field contains a 1 bit value. DS2V is a flag, which if set, indicates that the last data sector is split, and therefore that the value DS2Len is valid. In the preferred embodiment, this field contains a 1 bit value.

Since every segment within a given zone has the same number of bytes, for each zone it is only necessary to store format information for a single segment. The servo sector number within the segment (equivalent to the region number) is used to address the format information for the appropriate segment. The value DS1Num is included for performance reasons. Sector pulse logic 421 includes a data sector number counter, which starts counting data sector pulses at index. As long as the servo electronics remain active, the data sector number counter will be correct. However, when a zone switch occurs, the data sector number counter must be reset. On the other hand, it is preferable to avoid waiting for index to start counting data sectors, as this causes a latency penalty. With the DS1Num value, the counter is preset at every servo sector, thereby avoiding additional latency. Further, this technique allows the disk drive to recover quickly from power saving modes, where much of the electronics is powered down when not performing data operations. Using the present invention, the data sector counter will be preset with the correct value at the first servo sector following the end of power saving, rather than at index.

From the definition of the sector architecture shown in FIG. 3a, only the first and last data sections in any given data region may contain partial sectors. Therefore, only the lengths of these two sections must be stored in the table; thus the inclusion of DS1Len and DS2Len. NumFull is the number of complete data sectors in the data region. It is used to prevent the generation of false data sector pulses prior to the end of a region, where the end of a data sector may be close to the start of a servo sector, by disabling the data sector number counter once NumFull data sector pulses have been generated. It is also used to control the generation of data sector pulses for the data sectors which start within the region. DS1V and DS2V are used to indicate the validity of the DS1Len and DS2Len values. This is prompted by the necessity to know if the first data section in a region is a primary section so that a read or write operation initiated at a servo sector will not be started on a secondary data section. For example, in region 308 the DS1Num value after servo sector 312 is D2 for data section 324. However, a read or write request for data sector D2 must start at data section 322, therefore the servo electronics must ensure that data section 324 is not mis-identified as the start of data sector D2. Similarly, DS2V is used to indicate that the last data section is split by a servo sector. The use of these flag values is preferred for performance reasons, since they provide for a direct decode. However, it is apparent that the limited range of values for DS1Len and DS2Len allows for the use of specific values (e.g. 0) to provide the same function.

Only the lengths of the first and last data sections in a region must be stored in the table because all other sections are necessarily full length. Data-section-split flags are required only for the first and last sections since all others must be complete. DS1V will be zero if the first section is primary (that is, not split). DS2V is likewise used to initiate the split data sector function at the end of the last section if it is split.

It is to be noted that the above-described information may be stored in RAM memory as shown in FIG. 5, and addressed by the servo sector number within a segment. However, it is also possible to organize the information by data sector number, which may in turn be used to address the RAM. In this case the specific fields must change, but they still support the functions described above. Further, any or all of the above information may also be stored in any other convenient medium, such as in registers, flash memory, or any other storage device accessible to servo electronics 212.

Aside from the above-described information which is stored for each region in a segment, additional information is required, for each zone, to enable the servo processor to locate data sectors which are not positioned immediately following a servo sector. In FIG. 5, this information is contained generally in registers 506, including Sync Long register 520, Sync Short register 522, Pad Long register 524, Pad Short register 526, and Data Full register 528. Registers 520–528 are used to load the three counters in Sector Pulse Logic 421. All three counters (sync counter, data counter, and pad counter) are down counters whose input clocks are the current data byte clock. Only one counter is enabled at a time, in a sequence determined by the track format. Additional information for other operations is contained in n register 530, which holds the reduced numbers of data sectors per track, m register 532, which holds the reduced number of servo sectors per track, NDS register 534, which holds the number of data sectors per track, and DSkew register 536, which holds the data sector skew value.

Turning in particular to registers 520–528, Sync Long register 520 contains the number of byte clocks in VCO sync field 352. Sync Short register 522 contains the number of byte clocks in VCO Resync field 368. In the preferred embodiment, this field is shorter than field 352; however, if the fields are of equal length then only Sync Long register 520 is required. Pad Long register 524 contains the number of byte clocks in Data Pad field 356 when it is followed by VCO Sync field 352. Pad Short register 526 contains the number of byte clocks in Data Pad field 356 when it is followed by a servo sector. The Pad Long and Pad Short values are different since the servo sector contains W-R and Speed field 342, which shares some common function with Data Pad 356. Data Full register 528 contains the number of byte clocks in Data and ECC field 354, which is the total number of data and ECC bytes in a data sector.

During operation of servo electronics 212 in cooperation with RAM 504 and registers 506, the sync counter is started following a servo sector. Prior to this, the sync counter is preloaded from Sync Long register 520 if the value of DS1V is 0, and from Sync Short register 522 if the value of DS1V is 1. Further, if DS1V is 0, data sector pulse 444 is generated and the data counter is preloaded with the value in Data Full register 528. Otherwise it is loaded with the value in DS1Len. When the sync counter reaches 0, the data counter is started. If the number of data sector pulses generated in the region equals NumFull, then the pad counter is loaded with the value in Pad Short register 526; otherwise it is loaded with the value in Pad Long register 524. When the data sector counter reaches 0, the pad counter is started. When the pad counter reaches zero, the end of the current data sector has been reached. If the number of data sector pulses generated in the region equals NumFull, then a servo sector follows. Otherwise a data sector pulse is generated, the data sector number counter is incremented, and the sync counter is preloaded with the value in Sync Long register 520. This process repeats until the region is completed, which is determined by the generation of NumFull data sector pulses. When the number of data sector pulses generated in the region equals NumFull and DS2V is 1, then the data counter is preloaded with the value in DS2Len instead of with the value in Data Full register 528.

Three counters are used instead of one due to the types of fields being counted, to limit the number of tap points on a single counter, and to allow for each counter to be preloaded while another counter is running. It is to be noted that while a particular preferred counter arrangement has been disclosed, the above function can be implemented using many alternative counter and register arrangements whose result would remain within the spirit and scope of the present invention.

Using the above information, servo electronics 212 is able to locate the start of any data sector in a segment. Further, the sector number from index for a given data section may be determined using the equation:

$$SN[i] = m \times SGN + DS1Num + i \qquad (2)$$

where SN [i] is the data sector number from index (zero based) for the i-th data sector in the segment, and SGN is the segment number from index (zero based).

During operation of disk drive 202, read and write operations are received which require recording head 208 to be repositioned over various tracks and then to read or write various data sectors. Once recording head 208 is positioned over the appropriate track, the above equation is used to determine when the appropriate data sector is passing under the head. In particular, the equation is used to compute a current data sector number which is continuously compared with the data sector number requested for the read or write operation. If the values compare, the desired operation is performed. Since there are no ID fields, the data section lengths computed based on the data values described above identify the location of data in particular segments and regions.

In the preferred embodiment, various ones of the above-described information fields are maintained in various storage areas in order to improve operational performance. For instance, the information for the current zone may be maintained in dedicated local storage analogous to registers 520–536 in order to avoid bus arbitration. The values may be reloaded from general storage such as RAM 217 after each zone switch. The disk format determines the amount of storage required to hold the values for a particular implementation. Since known implementations require 32 or fewer regions per zone, the local storage requirements for the zone tables are 30 bits per region or 256 bytes per zone, including allowance for ECC. Thus, in the preferred embodiment, high performance may be achieved without incurring a storage access penalty.

IV. Servo-Modulo Counter

In order to use the above-described sector identification/location schema effectively, the system of the present invention must be able to determine both a segment number and a servo sector number within the segment prior to performing a read or write operation. To avoid the latency penalty created by waiting for an index mark as a basis to compute the above information, servo-modulo counter electronics are provided to generate this information continuously, even after a head or zone switch. In the preferred embodiment, this is achieved using a hardware circuit whose inputs are m, n, servo (servo sector number) and DS1Num.

Figure 6:
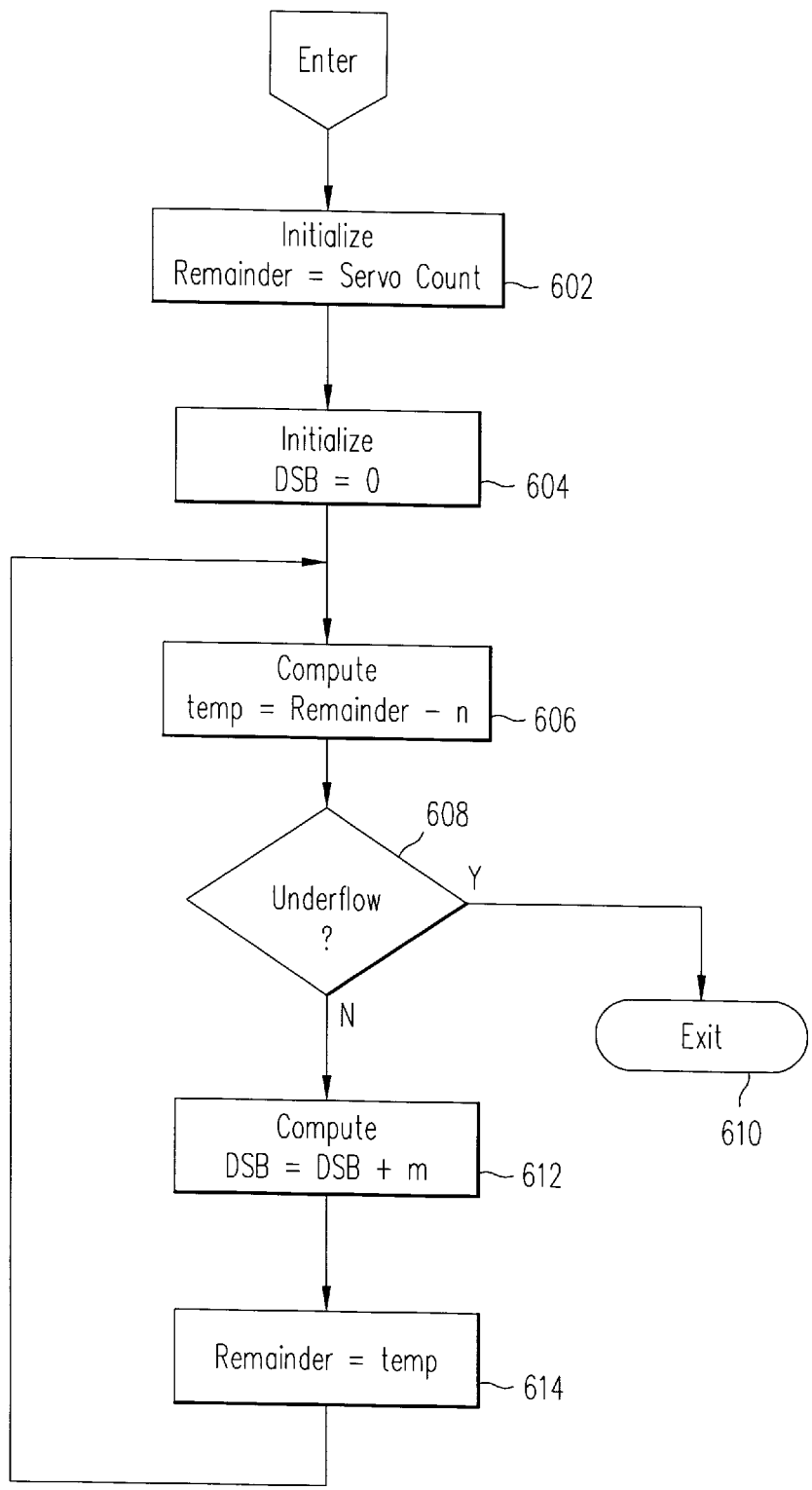
FIG. 6 is a flowchart illustrating servo-modulo computations in accordance with the present invention.

The purpose of the servo-modulo counter is to produce the quantities servo mod n and m×(servo /n). The former is the remainder of servo/n, the number of servo sector n from the start of the segment, which is used as the address for RAM-based zone table 504 described previously. The latter is the data sector number of the first data sector in the segment, hereinafter referred to as DSB, the data sector base number, which is also the first term in equation (2). FIG. 6 illustrates in flowchart form the operations required to perform these computations. At 602 the remainder value is initialized to the servo count. At 604, the quantity DSB is initialized to zero. At 606, a loop is entered which computes the value of servo mod n (remainder) by repeated subtraction until an overflow occurs. In particular, at 606 temp, a temporary variable, is assigned the value of remainder −n (of servo/n−n). At 608, the underflow test is performed (temp <0). If an underflow is detected, the process is exited at 610. If no underflow is detected, the processing continues at 612, where the quantity m is added to DSB. Finally, at 614 the remainder is set equal to temp (the remainder minus n), and processing returns to 606. At exit point 610, both DSB (m×(servo/n) ) and the remainder (servo mod n) have been computed.

Figure 7:
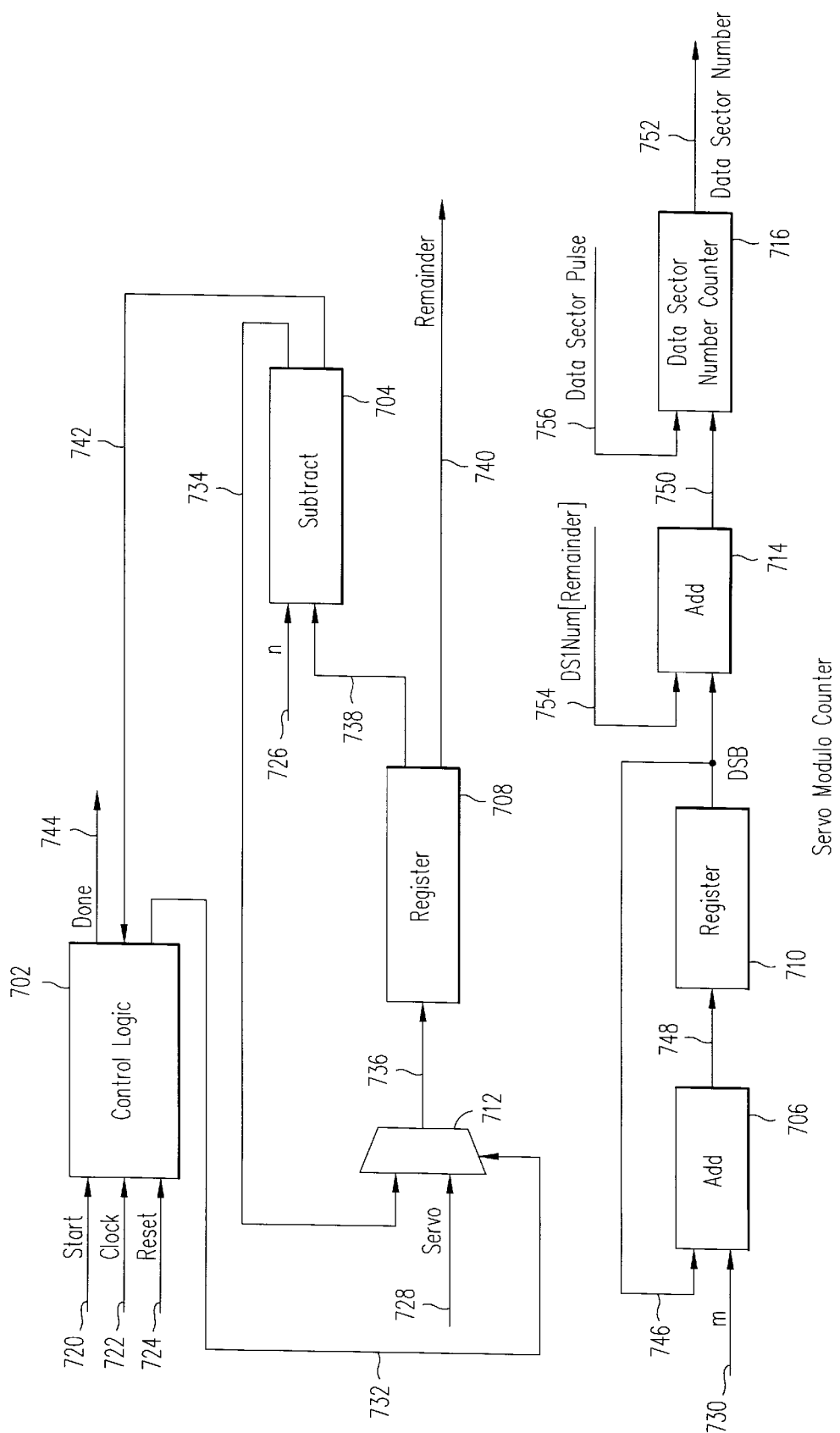
FIG. 7 is a block diagram illustrating a hardware embodiment of a servo-modulo counter in accordance with the present invention.

Shown in FIG. 7 is a schematic diagram illustrating an electronic circuit in accordance with the preferred embodiment of the present invention. The circuit computes the values of m×(servo/n) and servo mod n in accordance with the process shown in the flowchart of FIG. 6 and described above. As in the flowchart, servo mod n is computed by repeated subtraction which is halted by an underflow operation. The circuit includes control logic 702, subtracter 704, adder 706, registers 708 and 710, MUX 712, adder 714 and data sector number counter 716. In operation of the servo modulo counter circuit, control logic 702 receives start signal 720 to begin a computation, and produces done signal 744 when complete. Register 708 stores the result of the repetitive subtractions and at the end of computations contains the correct value of servo mod n (the remainder). Subtracter 704 receives input 738 from register 708 and input 726 (the value n) from register 530 (shown and discussed previously with reference to FIG. 5). The input to register 708 is from MUX 712. The MUX allows either the numerator, servo 728, or the results of the previous subtraction to load register 708. The register load signal (not shown) comes from control logic 702, and is asserted once per subtraction operation. Underflow signal 742 is passed to control logic 702. If an underflow is detected, the register load signal is stopped, and the remainder value will be stable on 740. Control logic 702 also controls the output from MUX 712 to register 708 via select line 732. MUX 712 is configured such that the first subtraction uses current servo count 728 while subsequent subtractions use the intermediate results. Further, register 708 is located prior to subtracter 704 so that it contains the results of the prior subtraction when the loop exits, since the exit condition is an underflow.

The value of m×(servo/n) is computed by repeated addition of the quantity servo mod m for each subtraction operation performed in the modulo block. Adder 706 adds input 730 (the value m) from register 532 (shown and discussed previously with reference to FIG. 5) and the result of the previous addition 746. The intermediate values of the addition 748 are stored in register 710 at the output of adder 706. The register load signal (not shown) comes from control logic 702, and is asserted once per addition operation. Control logic 702 synchronizes the addition and subtraction operations through the register load signals, thereby eliminating the need for a separate multiplier or an accumulator to compute DSB (m×(servo/n) ). When the operation is complete, DSB value 746 produced by the circuit may be used in accordance with equation 2 to generate the current data sector number. Specifically, result DSB 746 is passed to adder 714, along with DS1Num 754, addressed by remainder 740. These values are added and output at 750 as the data sector number from index of the first data sector in the segment. Data sector number counter 716 is preloaded with adder value 750 upon receipt of a load signal from the control logic (not shown). Data sector number counter 716 increments upon receiving data sector pulses 756, and outputs the current sector number at 752.

To avoid a latency penalty which would otherwise be created upon head or track switches due to the time required to settle on the new track, it is well known in the art to use cylinder and head skewing between disk surfaces and tracks of a data recording disk drive.

In accordance with the present invention, a technique is provided for implementing this skewing by adjusting the value in data sector counter 716 to account for the skew. The raw (unskewed) current data sector number 752 is adjusted by subtracting the value in Dskew Register 536 from the current data sector number 752. This subtraction is performed modulo the value in NDS Register 534. The result is the current skewed data sector number which may be provided as input 442 to Data Sector Identifier 454. Finally, it should be noted that while this skewing technique has been described with reference to data sectors, it may also be used equally effectively to implement skewing on the basis of servo sector number in a manner analogous to that described above.

V. Staggered Sector Servo

The use of a hardware-based servo modulo counter in accordance with the preferred embodiment insures that no latency is added for head or zone switches. For a zone switch, the servo sector counter maintains count of the servo location. Once servo and data modulo values of m and n are changed, the section length and data sector number will be correct. Similarly, for a head switch, once the servo count is correct, the remaining values follow.

Figure 8:
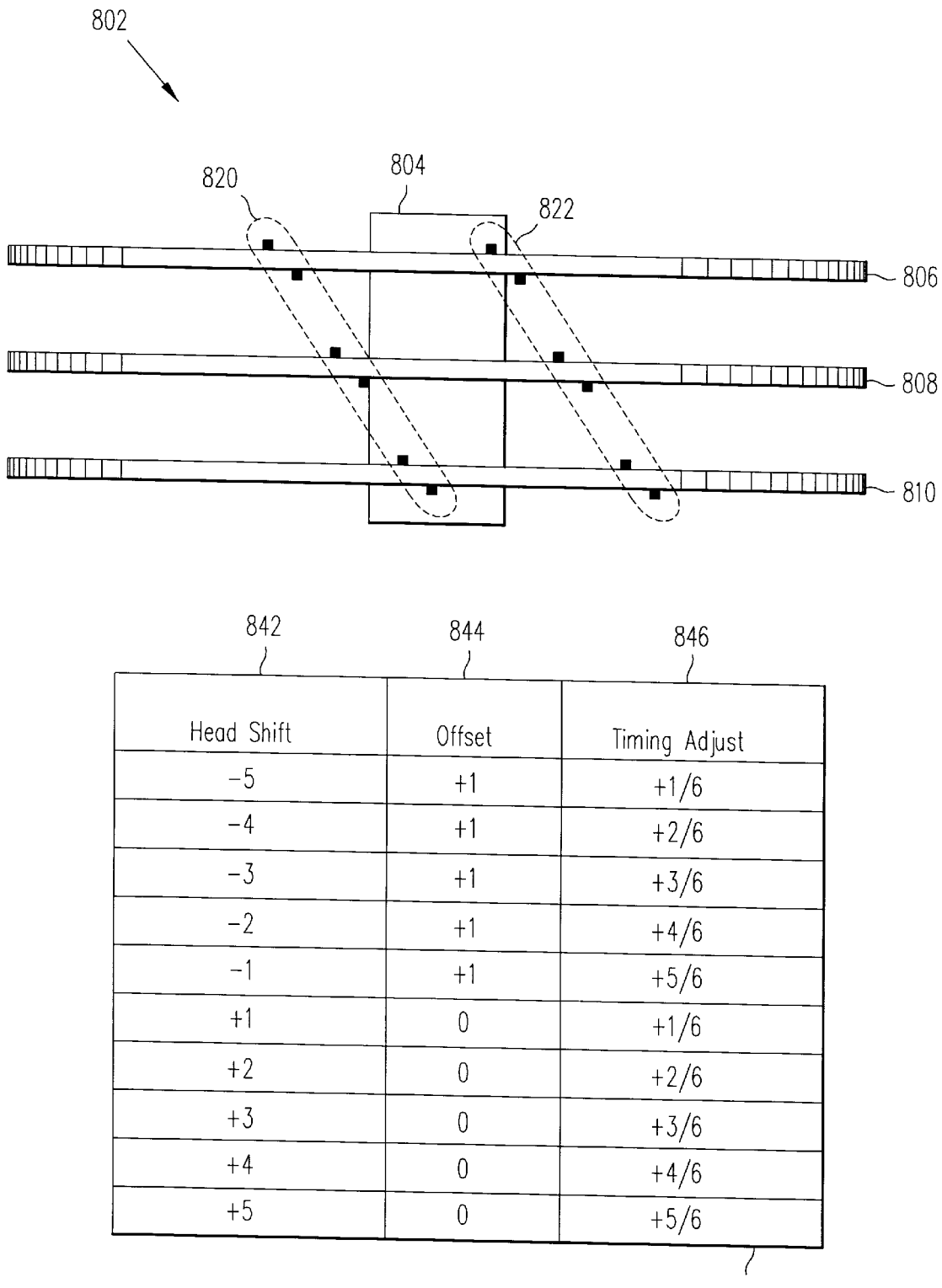
FIG. 8 is a schematic diagram illustrating a staggered sector servo written disk drive.

For a disk drive which implements a staggered sector servo approach, the servo counter value must be set properly following a head switch in order to account for the staggering. FIG. 8 illustrates, in cross-sectional view, a staggered sector servo disk drive. The disk drive is generally designated 802, and includes spindle 804 and disks 806, 808 and 810. The locations of the servo sectors are shown schematically as black rectangles in two groups 820 and 822. The servo sectors are not vertically aligned, rather they are arranged diagonally to permit the servo writing of all surfaces of the disk drive in a single pass write per track. After using one head to write a servo sector on one surface, the next head (on the next surface) is activated and a servo sector is written there, allowing multiple surfaces to be written in one revolution, decreasing the servo write time and cost.

To write a staggered sector servo pattern in accordance with the present invention, the servo sector counter must be synchronized with the servo sector numbers on the surface being switched to. This function may be accomplished by writing a subset of the servo sector number (possibly the entire sector number) into the TID information in position field 346. Alternatively, servo sector counter 414 may be updated based on a lookup table containing the stagger offsets. In the former case, the servo sector number read from the servo sector is decoded by AM detector 412 and passed to safety logic 416. Safety logic 416 uses this value to update servo sector counter 414.

For example, the entire servo sector number may be encoded in the TID. Following a head switch, safety logic 416 uses the read value to preload servo sector counter 414, ensuring synchronization. In the lookup table case, a table of offsets is kept which is used to increment or decrement the value in servo sector counter 414. An exemplary table is shown at 840. The table comprises 3 columns, head shift 842, servo sector counter offset 844 and servo timing adjustment 846. Upon commencement of a head switch, the head shift value (plus being down, minus being up) is used to look up the servo counter offset and timing adjustment. Offset values 844 are used to increment or decrement servo sector counter 414. Timing adjustment values are used by timing logic 420 to adjust for the new servo sector positions. For convenience, the values in column 846 are listed as fractions of the servo-to-servo spacing. Thus, for example, if the current head is on the lower surface of disk 806, and a head switch to the upper surface of disk 810 is desired, the head switch value would be +3. From lookup table 840 the servo sector count increment would be 0, and the servo sector timing adjustment would be ½ of the servo-to-servo spacing. The table construct shown in FIG. 8 also allows for more general offsets, such as skewing the index from surface to surface. This would result in a unique value for each head shift value. Further, the table may be used in conjunction with encoding the servo sector number in the TID to add a further degree of reliability to the system. Of course, this table may be stored in RAM or any other appropriate medium.

VI. Converting from LBA to ZCHS

As discussed previously, in order to find a requested data sector on a disk a received logical block address (LBA) must be converted into a zone, cylinder, head, sector (ZCHS) value. In general, this involves first converting the LBA, which is the user identifier for the data sector, into a physical block address (PBA) which is a mapping of the LBA into the physical space of the disk drive. The aforementioned Hetzler application (07/727,680) teaches the use of a defect map and a basic process for performing the LBA to PBA mapping. However, since the LBAs for neighboring defects share most of their high order bits, much of the information stored in the defect map is redundant, serving only to hamper performance and unnecessarily occupy RAM. The present invention includes a particular map which removes the high order bits of each LBA to minimize the bits required in representing each defect. The map takes account of skip sectors allocated on the disk, either due to defects or sparing, with use of a minimum amount of RAM and in a fashion that increases the performance of the disk drive.

The map is implemented as a pair of tables known as a virtual track (VT) table—which contains entries representing the mostly redundant high order bits of the LBA—and a virtual sector (VS) table—which contains entries representing only the low order bits of the LBA—. The output of the VT/VS table access, the PBA, is then located in a zone conversion table in order to develop coefficients for use in computing the cylinder, head, and sector at which to perform the desired operation on the requested data sector. Thus, two conversions are used, the first of which removes skip sectors and the second of which provides the appropriate ZCHS value. The invention reduces the storage required for conversion to either two or one bytes per entry plus an offset based on the drive capacity and choice of one or two byte entry. The invention further reduces the magnitude of the search required to locate an LBA and thus the performance impact of the searching process.

Figure 9:
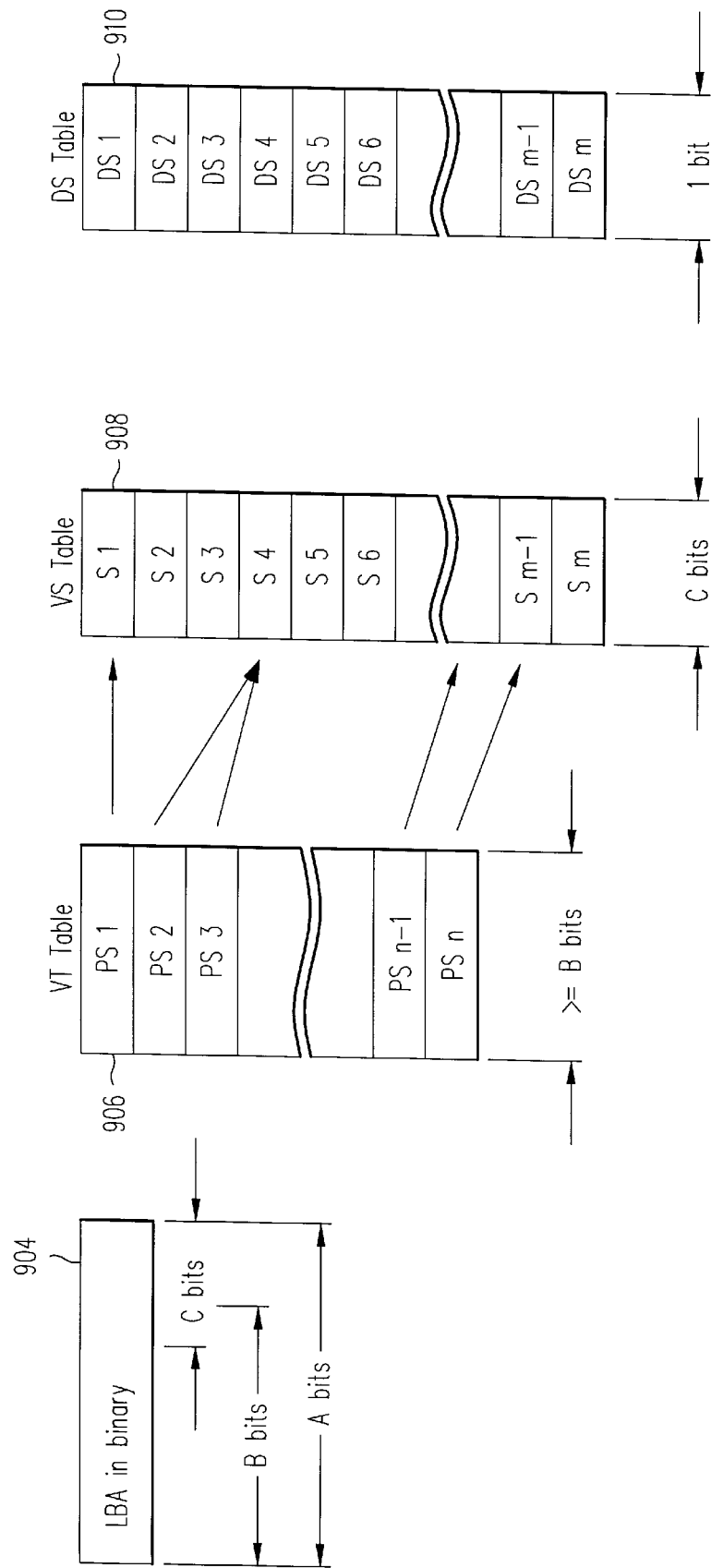
FIG. 9 is a schematic diagram illustrating an LBA to PBA mapping architecture in accordance with the present invention.

Shown in FIG. 9 is the LBA to PBA mapping architecture which forms the basis for the LBA to PBA portion of the conversion process. In particular, the figure shows the LBA represented in binary form at 904, virtual track table 906, virtual sector table 908, and defect spare table 910. As shown at 904, the LBA as received from the disk drive interface is first subdivided into two sections. The full length of the LBA in bits, shown as A, includes the number of bits in the high order portion required to hold the virtual track number, designated as B, as well as the number of bits required to hold the virtual sector number, designated as C.

A virtual track is defined as a contiguous set of data sectors which have exactly $2^{(A-B)}$ good data sectors. A virtual track may contain both good sectors and skip sectors or alternatively it may contain only good sectors. All virtual tracks are contiguous with one another starting from a defined virtual track of zero at the beginning of the disk drive and running through the entire disk drive. Sub spaces of the disk drive may also be mapped separately in the same manner. The virtual track number may be obtained from the LBA either by simply tapping the high order bits of the LBA or by logically shifting the LBA to the right by the quantity A-B shifts. A virtual sector is defined as a good sector contained within a virtual track. There are $2^{A-B}$ different virtual sector numbers available. Thus, all virtual sectors within a virtual track are numbered consecutively starting at the first good sector in the track and ending at the last sector in the track.

Given a subdivision of an LBA into a virtual track number and a virtual sector number, the virtual track number is referenced into virtual track table 906 in order to obtain an index point into virtual sector table 908. The index point is used as a starting point in VS table 908 at which a sequential search is commenced, which search continues until a virtual sector number which is higher than the searched-for virtual sector number is located in virtual sector table 908 or the index exceeds the entry for the next virtual track. Once the appropriate entry is found, the PBA is computed as the received LBA plus an index into VS table 908 corresponding to the final search entry.

VT table 906 contains an entry corresponding to every virtual track in the disk drive. Each entry is at least B bits wide and contains a pointer into VS table 908. The arrangement of the table thus gives each entry two meanings. First, the entry value identifies the total number of skip data sectors prior to the virtual track represented by the entry. Second, this same value represents the correct entry point into the virtual sector table at which the skip sectors are listed for the virtual track number represented by the entry. In operation, VT table 906 is entered by indexing into it according to the value of B, the virtual track number, obtained from entry 904. The value found at the determined index point is then added to the start of VS table 908 to locate the first skip sector associated with the applicable virtual track.

Unlike VT table 906, VS table 908 does not contain an entry for every virtual sector on the disk drive. In contrast, VS table 908 need only contain entries for skip sectors (defective sectors and/or spare first sectors). Each entry in VS table 908 corresponds to the good virtual sector following skip sector. As discussed above, VS table 908 is entered at the index value established through use of VT table 906. Starting at that index value, a sequential search is conducted against the value of the C bits received from the low order of LBA value 904 until a virtual sector number is located which is greater than the value obtained from the low order C bits of 904. This greater-than virtual sector number establishes the number of skips which must be passed in order to arrive at the correct virtual sector number. An offset value which is equal to the offset into virtual sector table 908 of the first entry which is greater than the sought-after virtual sector number is added to the LBA to arrive at the PBA value unless the next virtual track starts where the index is, in which case this offset/index is added to the PBA value.

DS table 910 contains an entry for each entry in VS table 908. The purpose of DS table 910 is to distinguish the virtual sector entries in VS table 908 as either corresponding to defective data sectors, also known as bad blocks, or to spare data sectors, also known as spare blocks. In the preferred embodiment, DS table 910 comprises a single bit entry corresponding to each entry of VS table 908, wherein the polarity of the bit in each entry is used to distinguish between bad blocks and spare blocks. It is to be noted that an advantage of DS table 910 is that this table does not need to be resident in RAM storage except during reassignment operations. Reassignment operations occur when grown defects develop during use of the disk drive, at which time spare sectors are reassigned as active sectors, and the defective active sectors are reassigned as skip sectors. Part of the reassignment operation involves changing bit values in DS table 910, in addition to various values in VT table 906 and VS table 908. Of course, in order to change values in DS table 910, this table must be resident in RAM accessible to the microprocessor. At all other times, DS table 910 need not be resident or readily accessible to the disk drive electronics, because there is no requirement that the electronics determine whether a sector identified in VS table 908 is bad or spare; rather it is only necessary for the electronics to determine that the sector is a skip sector.

Figure 10:
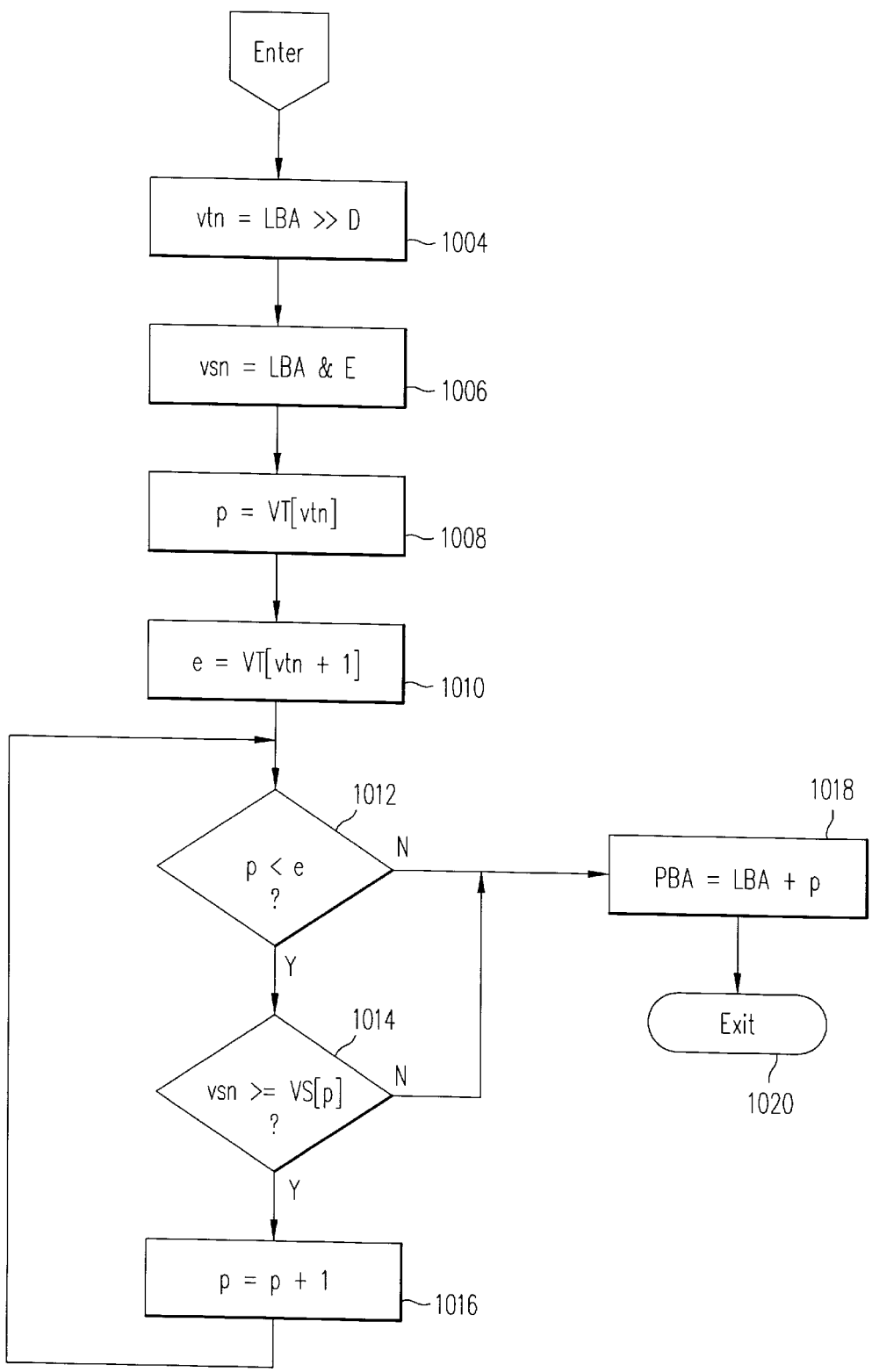
FIG. 10 is a flow chart illustrating LBA to PBA conversion computations in accordance with the present invention.

Shown in FIG. 10 is a flowchart illustrating the LBA to PBA conversion computations. The conversion computations perform three basic functions. First, they set the bounds on the search to be conducted through VS table 908. This is accomplished by examining the virtual track number entry identified in the LBA along with the succeeding virtual track number entry in VT table 906 to establish starting and ending offsets in the virtual sector table. Second, once the bounds of the search are set, the conversion process sequentially searches through VS numbers in the VS table until its position in the table corresponds to the starting point of the next virtual track (that is, the upperbound of the search) or a VS table entry greater than the C bits is found. Third, as a criterion of the search, each virtual sector number in virtual sector table 908 must be greater than or equal to its predecessor unless a virtual track boundary is crossed, at which point searching is ended.

With particular reference to FIG. 10, the variable D is taken to represent the quantity A-B, where A is equal to the number of bits in the LBA while B is equal to the number of bits in the virtual track number. Thus, D corresponds to the number of right-hand shifts of the LBA required to obtain the virtual track number. The variable E represents the quantity $2^c-1$, where c is equal to the number of bits in the virtual sector number. Thus, E simply provides an AND mask for use in determining the virtual sector number. It is to be noted that the values of D and E are established according to system parameters. For instance, since most modern microprocessors handle bits in multiples of 8, it may be desirable to establish D and E so that all values are provided in multiples of 8 bits. Finally, p refers to the present offset in the virtual sector table.

The flow chart of FIG. 10 is entered at 1004, where VTN is set equal to the LBA shifted right by a quantity of D bits. Next, at 1006, the virtual sector number is set equal to the LBA anded with E. Thus, at this point the logical block address has been separated into its virtual track number and virtual sector number components. Next, at step 1008, the present offset into the virtual sector table is set equal to the value found in the virtual track table at the virtual track number offset. This establishes a starting point for further searching in the virtual sector table. Next, at step 1010, the value of E is set to the next virtual track number (the upper bound of the search to be executed on the virtual sector table).

At 1012, a loop is entered in which a test is performed to determine whether the end of the virtual track has been reached. It is to be noted that if this case occurs on the first iteration through the loop, the result would indicate that the present track contains no defective sectors. If the end of the track has not been reached, at 1014 a second test is performed in which it is determined whether the virtual sector being searched for still exceeds the virtual sector entry being tested in the virtual sector table. If the result of the test is positive, this indicates that the sought after index has not yet been located. In this case step 1016 is executed to increment the present offset into the virtual sector table to the next virtual sector table entry. After this, control is returned to the beginning of the loop at 1012. If the result of the virtual sector number comparison conducted at step 1014 is negative, this indicates that the sought-after virtual sector index has been located in the virtual sector table. The effect on the flow control is the same as if the end of the track is detected at step 1012, and results in entry to step 1018. At 1018, the search is finalized by setting the PBA equal to the LBA added to the value of the present offset in the virtual sector table. Finally, the process is exited at 1020.

An important advantage is achieved through the use of overlap between certain portions of the virtual track number and the virtual sector number. This overlap feature can be seen in the definition of the LBA shown at element 904 in FIG. 9 with reference to the B bits and C bits defining the virtual track number and the virtual sector number, respectively. When such an overlap is present, a portion of the virtual sector number corresponds to the least significant bits of the virtual track number. This overlap is intentionally provided in order to improve the mapping efficiency from the LBA to the PBA. The overlapping bits between the virtual track number and the virtual sector number give the virtual sectors the ability to distinguish between adjacent and nearby virtual tracks without having to refer back to the virtual track table. The amount of overlap between the virtual track number and the virtual sector number establishes the quantity of virtual tracks that may be distinguished from one another using a single virtual sector number. Since the entries in the virtual sector table occur in increasing numerical order, so long as there is at least one skip sector represented in the virtual sector table within the quantity of virtual tracks that can be distinguished using a single virtual sector number, the virtual sector table alone can be used to detect all changes in the virtual track number and indeed can be further used to count the virtual track number associated with the various entries in the virtual sector table. Thus, the search through the virtual sector table may be performed without having to revisit the virtual track table each time a virtual track boundary is crossed.

A second advantage of encoding some of the least significant bits of the virtual track numbers into the virtual sector numbers becomes apparent when computing absolute distances between skips across track boundaries. For two skips which are separated by one or more track crossings, so long as the distance between them is within the resolution of the overlap bits provided in the virtual sector, the virtual sector value for one skip sector can be subtracted from the other to establish an absolute number of sectors between the skips. Thus, absolute distance computations may be performed across track boundaries also without reference to the virtual track table.

Once the physical block address has been computed, a second conversion takes place in which the PBA is further converted to zone, cylinder, head, and sector location. FIG. 11 illustrates the zone conversion storage components required to initiate the conversion process in a zone bit recording disk drive. The table is generally designated as 1104 and is preferably stored in RAM, but may alternatively be stored on any other convenient media. Zone table 1104 includes three columns, zone PBA column 1110, zone cylinder column 1112, and zone sector column 1113. Zone table 1104 includes an entry for each zone in the disk drive. The first column of each entry, zone PBA 1110, identifies the starting PBA of that zone, and is used to determine which zone a desired PBA is located in. Thus, the top entry in the table would identify the first PBA in zone 1 of the disk drive, etc. The sought-after PBA number is compared with each zone PBA entry until the zone containing the PBA is located. The corresponding entries in zone cylinder column 1112 and zone sector column 1113 are then used to perform the conversion computations which will be described below.

Figure 12:
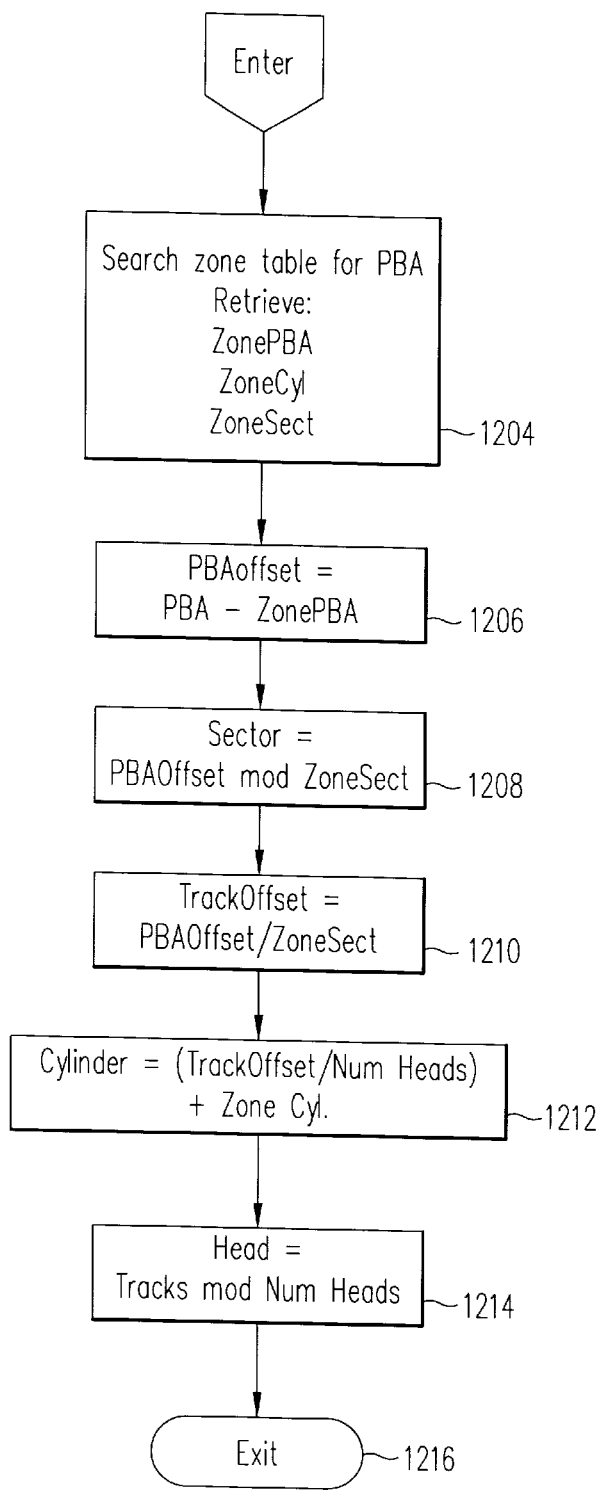
FIG. 12 is a flow chart illustrating PBA to zone, cylinder, head, sector computations in accordance with the present invention.

FIG. 12 illustrates in flowchart form the steps which are preformed, once the zone conversion storage components have been located, to convert from PBA to ZCHS. At step 1204, the zone table is searched for the sought-after PBA number to retrieve the zone PBA, zone cylinder, and zone sector entries as described with reference to FIG. 11. At step 1206, zone PBA is subtracted from PBA to determine how many physical blocks (sectors) into the zone the desired PBA resides. A PBA offset into the zone is returned from this operation. At 1208, the PBA offset is divided by the number of sectors per track. The mod, or remainder of this operation is designated as the starting sector number of the data transfer. At step 1210, the quotient of the same division process is taken as the track offset from the start of the zone at which the data transfer is to begin. At 1212, the absolute cylinder number which starts the data transfer is computed by dividing the track offset by the number of heads in the disk drive to produce a cylinder offset which is then added to the starting cylinder of the zone. Finally, at 1214 the remainder, or mod of the same division provided in 1212 is taken as the selected head for the start of the data transfer. At this point the process exits at 1216, having computed the zone, cylinder, head, and sector at which to begin the data transfer.

One beneficial result of decoupling the LBA to ZCHS conversion process into two stages is a two step mapping process which significantly reduces the number of spares that must be allocated across the disk drive to handle grown defects occurring in the field. The two step LBA to ZCHS process in turn allows the allocation of skip sectors to be broken into a two step process. First, surface analysis testing (SAT) is performed across the entire disk drive to determine the factory defect locations before the disk drive is shipped from the factory. The defect locations are mapped into a virtual sector table by inserting skip sectors in numerical order. Also, a virtual track table is created and updated as required by incrementing each virtual track entry following that track in which the error is detected. Second, after SAT is complete, spare locations are sprinkled evenly across the disk at distances consistent with the probability of a grown defect. It is to be noted that the probability of a grown defect, and thus the density of spares, may vary as a function of position on the disk. The result is that sparing is reduced to minimal levels.

Given the above scheme for sparing, two alternative embodiments for reassignment of sectors are presented. Both reassignment techniques are intended to map a spare sector into the logical address space of the disk drive as well as to map the defective sector into the virtual sector table and, if necessary, the virtual track table, in order to establish the defective sector as a skip sector.

For either technique the re-assignment process begins by identifying the closest available spare sector (to be used as the reassignment sector). This involves accessing the DS table and searching both forward and backward from the entry closest to the defect until a spare entry is found. The locations of the forward and backward entries are subtracted from the defect location, and the lowest absolute value result is used to select the re-assigned sector. Once the re-assignment sector has been identified, one of the two re-assignment techniques is applied.

Turning to the first, the original tables are left unmodified, and a separate list of re-assigned sectors is maintained. This separate list contains sectors chosen from the sprinkle list which have been used as re-assigned sectors. The list is in the form of a map which includes a first column representing grown defective ZCHS values and a second corresponding column representing new ZCHS values. The list itself may be organized either by LBA number or ZCHS number. If it is organized by LBA number, it is checked before translation from LBA to PBA. In this case, the list entries are interpreted to indicate which LBAs are mapped out and what new LBAs they are mapped to. If the list is organized according to ZCHS values, then it is referenced after translation from LBA to PBA and from PBA to ZCHS, and its entries are interpreted to indicate which ZCHS values are mapped out and what new ZCHSs they are mapped to. In any event, when the defective reassigned sector is encountered during a data transfer operation, a second seek is executed to the assigned spare location and the data is read or written there. However, as discussed above, since the spares are sprinkled throughout the disk drive and the drive has selected for use the sprinkled spare nearest the defective re-assigned sector, the length of the seek is minimized and performance is thereby improved.

The second re-assignment technique effectively replaces the grown defective spare with the selected re-assign spare in the virtual track and virtual sector tables. The virtual sector table is modified by inserting a new skip sector at the grown defect and then shifting all values between the grown defect and the reassigned sector. If the closest spare is across a track boundary from the defect, the virtual track table is also updated to indicate the pointer changes. Thus, by simply shifting LBAs in the virtual sector table between the defect and the reassigned sector, the spare takes the logical place of the defect and no performance degradation is experienced thereafter.

It is to be noted that the skip sector conversion schema has the additional advantageous property of operating in the presence of skewing without further modification. Where skewing is in effect, prior computations which compute sector number are considered to be with reference to unskewed sectors. Conversion to skewed sector then occurs outside the conversion process, as was described previously.

One modification to the above-presented embodiment, which may be useful in cases where simplified mapping is desired, is to use a single table conversion process which maps directly from LBA to ZCHS. The table entries still require three or four bytes as in the prior art, however the new table construction is based on LBAs adjusted by table location. Thus, the table contains LBAs which directly follow a given skip. The advantage of this approach is that the table look-up process requires only a simple single level search, either sequential or binary. The RAM requirement is fairly small so long as the number of skips in the system is kept small. However, for large modern disk drives the storage requirement expands rapidly as the number of defects increases, thereby overwhelming the utility of this approach.

It is also to be noted that the skip sector mapping technique disclosed in this section is useful beyond the realm of no-ID disk drives. In fact, this technique is considered applicable to any disk drive in which benefit may be obtained from knowing conclusively at the beginning of every seek operation exactly what the final target zone, cylinder, head, and sector are. Thus, in all disk drives, including those using ID fields and those using no ID information, the disclosed LBA to ZCHS mapping avoids the requirement to slip heads in order to handle spares and defects. Moreover, the system leads to easy implementation of just-in-time seek profiles, where knowledge of the exact seek destination is used to plan the seek trajectory so that the head settles on track just before the desired sector arrives at the head. Finally, the system allows for implementation of seek reordering including latency minimization, since the exact seek destination is known before seeking.

Most importantly, it should be noted that while the above description has focussed on partitioning the LBA into two portions, the concept may easily be extended to three or more partitions. For example, a virtual cylinder partition may be added which contains neighboring virtual tracks. This becomes advantageous as the number of virtual tracks becomes large, since it reduces the amount of storage required for the virtual track table. Thus, in general the mapping schema presented above should be taken to encompass n-level hierarchical storage of skip sectors.

VII. Conclusion

A further advantage of the preferred embodiment hardware design lies in its built-in power management features. Since the servo-modulo count block actually computes the modulos, the system requires only a single servo sector time for initialization. The field length counters in sector pulse logic 421 must operate only during read and write modes, and may be powered down otherwise. Thus, in a low power implementation of the present invention, much of servo electronics 212 and formatter electronics 215 is powered down between read and write operations. Typically, timing logic 420 is active during this time, and generates signals to activate AM detector 412 and other electronics at each servo sector. Since the servo sector counter is active, a read or write operation may commence following the next servo sector. If even greater power savings is desired, an additional stage may be added in which the servo sector counter and associated electronics are powered down. In this mode, the system must wait for an index to initialize itself if the full servo sector number is not encoded within the TID. If it is encoded, the system need only wait for the next servo sector.

While the invention has been described with reference to data sectors which are shorter than the data regions separating servo sectors, it is to be noted that the invention is equally applicable to the opposite case—that is, a sector size or servo spacing selected such that the data sector length exceeds the data region length. This may occur in an implementation which uses closely-spaced servo sectors for performance or other reasons. It may also occur where the data sector size is chosen to be relatively large for use in applications dealing with long blocks of information, such as multimedia presentations and scientific data. The result of the data sector size exceeding the data region size is that a single data sector may span two or more servo sectors. This is handled seemlessly according to the invention as disclosed above by simply programming the register and RAM values accordingly.

While the preferred embodiment hardware design uses a servo modulo counter to reduce memory requirements, it is apparent that the segment information may be expanded to store the information for an entire track. In this case, there is no need for the servo modulo counter, since RAM 504 will be addressed directly by servo sector number. Such a design uses more RAM than the preferred embodiment, but will have simplified hardware. The choice of designs depends on factors such as circuit cost for the two implementations. Further, the data in RAM 504 may be organized to allow addressing by values other than the servo sector number. Specifically, the data sector number may be used to address the table.

Further, it is to be noted that in some implementations it may be judged beneficial for error handling purposes to include some portion of the LBA in each data sector. This allows for LBA verification during read operations, but is of no use during write operations since the sought-after sector is being overwritten rather than read. Accordingly, LBA encoding in data sectors is not to be considered as analogous to ID information encoding in data sectors. Moreover, it is intended that the removal or exclusion of ID information as discussed above encompasses an implementation which removes the ID from data sectors information, but includes the LBA.

It is also apparent that the locations of the various functions shown in the electronics may be altered, and that software may be substituted for some of the hardware shown without departing from the spirit and scope of the invention. It is further apparent that while the preferred embodiment has been described in the context of a zone recording format, the invention may be applied to other complex formats where the number of data sectors on a track is not equal to the number of servo sectors on a track, so long as the format details are known to the disk drive. Moreover, the terms register and RAM should be viewed as interchangeable, and the specific locations of the registers and RAM as unimportant. For example, registers 506 and RAM 504 may be located within RAM 217 instead of format table 422. Finally, it should be noted that while the values and tables described above are stored in RAM and registers during operation of the disk drive, they must be stored in non-volatile storage when the drive is not operating. Any non-volatile storage may be used, but it is preferred to store the information on the disk drive itself. The use of modifiable storage (i.e., the disk drive) allows for the disk drive to alter its own format without need for external intervention.

While the invention has been particularly described and illustrated with reference to a preferred embodiment, it will be understood by those skilled in the art that changes in the description and illustrations may be made with respect to form and detail without departing from the spirit and scope of the invention. Accordingly, the present invention is to be considered as encompassing all modifications and variations coming within the scope defined by the following claims.

We claim:

1. In a disk drive having a data recording disk with radially spaced tracks and circumferentially spaced sectors and a head capable of reading information from the data recording disk, a method for converting a logical address to a physical address, comprising the steps of:

receiving a requested logical address;

selecting a first subset of bits from the logical address;

referencing the first subset of bits into a first sector mapping table to select a first index value;

referencing the first index value into a second sector mapping table to select a search start location;

selecting a second subset of bits from the logical address;

searching the second sector mapping table, starting at the search start location, until a table entry value greater than or equal to the value of the second subset of bits is found;

upon completion of the search, determining a second index value associated with the found table entry value wherein the second index value represents an offset from a physical location on the disk; and combining the second index value with the logical address to obtain the physical address.

2. The method as recited in claim 1, wherein the first subset of bits is selected from a high order portion of the logical address.

3. The method as recited in claim 2, wherein the second subset of bits is selected from a low order portion of the logical address.

4. The method as recited in claim 1, wherein the entries in the second sector mapping table represent any of defective sectors and spare sectors.

5. In a disk drive having a data recording disk with radially spaced tracks and circumferentially spaced sectors, a hierarchical sector map for mapping out skip sectors, the hierarchical sector map having entries arranged in groups according to shared logical address bits, wherein an index value associated with each entry represents an offset from a physical location on said disk, the groups having at least some of the shared bits omitted from the entries, wherein the groups are indexed from a higher level in the hierarchy according to at least some of the shared logical address bits, wherein a high order portion of a logical address specified in a data request received by the disk drive is used to select an entry in the higher level of the hierarchy, wherein a low order portion of the specified logical address is used to search within the lower level of the hierarchy, wherein the low order portion of the specified logical address overlaps the high order portion of the logical address.

6. In a disk drive having a data recording disk with radially spaced tracks and circumferentially spaced sectors, a system for mapping logical block addresses around skip sectors, the logical block addresses having logical address bits, comprising:

a first sector mapping table having entries grouped according to track identifiers associated with the entries, each entry corresponding to a skip sector and being associated with an index representing an offset from a physical location on the disk, the entries including a first subset of the logical address bits; and a second sector mapping table having entries arranged sequentially according to a second subset of the logical address bits, each entry comprising an index into the first sector mapping table, wherein a high order portion of a logical address specified in a data request received by the disk drive is used to select an entry in the second sector mapping table, wherein a low order portion of the specified logical address is used to search within an indexed group of entries in the first sector mapping table, wherein the low order portion of the specified logical address overlaps the high order portion of the specified logical address.

7. In a disk drive having a data recording disk with radially spaced tracks and circumferentially spaced sectors and a head capable of reading information from the data recording disk, a method for converting a logical address to a physical address, comprising the steps of:

receiving a requested logical address;

selecting a first subset of bits from the logical address, wherein the first subset of bits is selected from a high order portion of the logical address;

referencing the first subset of bits into a first sector mapping table to select a first index value;

referencing the first index value into a second sector mapping table to select a search start location;

selecting a second subset of bits from the logical address, wherein the second subset of bits is selected from a low order portion of the logical address and the first subset of bits overlaps the second subset of bits;

searching the second sector mapping table, starting at the search start location, until a table entry value greater than or equal to the value of the second subset of bits is found;

upon completion of the search, determining a second index value associated with the found table entry value wherein the second index value represents an offset from a physical location on the disk; and combining the second index value with the logical address to obtain the physical address.

* * * * *